(12) United States Patent
Mendelson et al.

(10) Patent No.: US 12,203,986 B2
(45) Date of Patent: Jan. 21, 2025

(54) RANDOM FUNCTION SELECTION AND INSERTION DURING COMPILATION FOR POST-SILICON VALIDATION

(71) Applicant: International Business Machines Corporation, Armonk, NY (US)

(72) Inventors: Hillel Mendelson, Glen Iris (AU); Idan Horowitz, Haifa (IL); Karen Holtz, Jerusalem (IL); Dani Szebenyi, Moran (IL); Ido Plat, Shimshit (IL)

(73) Assignee: International Business Machines Corporation, Armonk, NY (US)

( * ) Notice: Subject to any disclaimer, the term of this patent is extended or adjusted under 35 U.S.C. 154(b) by 40 days.

(21) Appl. No.: 18/323,716

(22) Filed: May 25, 2023

(65) Prior Publication Data
US 2024/0393395 A1    Nov. 28, 2024

(51) Int. Cl.
*G01R 31/319* (2006.01)
(52) U.S. Cl.
CPC .............. *G01R 31/31908* (2013.01)
(58) Field of Classification Search
None
See application file for complete search history.

(56) References Cited

U.S. PATENT DOCUMENTS

| | | | |
|---|---|---|---|
| 10,061,685 B1 | 8/2018 | White | |
| 11,194,705 B2 | 12/2021 | Mendelson | |
| 11,204,859 B2 | 12/2021 | Kolan | |
| 2005/0086565 A1 | 4/2005 | Thompson | |
| 2009/0222694 A1 | 9/2009 | Adir | |
| 2011/0087861 A1 | 4/2011 | Bertacco | |
| 2013/0013246 A1 | 1/2013 | Adir | |
| 2015/0186250 A1 | 7/2015 | Friedler | |
| 2022/0381824 A1 | 12/2022 | Mendelson | |

OTHER PUBLICATIONS

A. Adir et al., "Threadmill: A post-silicon exerciser for multi-threaded processors," 2011 48th ACM/EDAC/IEEE Design Automation Conference (DAC), San Diego, CA, USA, 2011, pp. 860-865. https://ieeexplore.ieee.org/document/5981876.

Anonymous (2013) Method and tool for measuring test-template variability. https://priorart.ip.com/IPCOM/000227917.

(Continued)

*Primary Examiner* — Guerrier Merant
(74) *Attorney, Agent, or Firm* — Kelsey M. Skodje

(57) ABSTRACT

A computer system, computer readable storage medium, and computer-implemented method for generating a test program for a device-under-test (DUT). The method includes transmitting a plurality of uncompiled snippets and a plurality of uncompiled micro-functions into a compiler. The method also includes selecting, randomly, a portion of uncompiled micro-functions from the plurality of uncompiled micro-functions. The method further includes compiling the uncompiled snippets and the portion of uncompiled micro-functions, thereby generating a plurality of compiled snippets and a compiled portion of micro-functions. The method also includes interweaving, randomly, the compiled portion of micro-functions with the plurality of compiled snippets, thereby at least partially generating a test program for the DUT. The method further includes executing one or more post-silicon validation tests for the DUT with the test program.

20 Claims, 9 Drawing Sheets

(56) References Cited

OTHER PUBLICATIONS

Kadry et al., "Improving Post-Silicon Validation Efficiency by Using Pre-Generated Data," ResearchGate, Nov. 2013, 16 pages. <https://www.researchgate.net/publication/299681518_Improving_Post-silicon_Validation_Efficiency_by_Using_Pre-generated_Data>.
Moharikar et al., "Automated test generation for post silicon microcontroller validation," 2017 IEEE International High Level Design Validation and Test Workshop (HLDVT), Dec. 7, 2017, 8 pages. <https://ieeexplore.ieee.org/document/8167462>.
S. K. Sadasivam, S. Alapati and V. Mallikarjunan, "Test Generation Approach for Post-Silicon Validation of High End Microprocessor," 2012 15th Euromicro Conference on Digital System Design, Cesme, Turkey, 2012, pp. 830-836, doi: 10.1109/DSD.2012.148.
Storm, J. (2006) Random Test Generators for Microprocessor Design Validation. Sun Microsystems, Inc. https://www.oracle.com/technetwork/systems/opensparc/53-rand-test-gen-validation-1530392.pdf <Retrieved Mar. 30, 2023>.

RANDOM FUNCTION SELECTION AND INSERTION DURING COMPILATION FOR POST-SILICON VALIDATION

BACKGROUND

The present disclosure relates to testing semiconductor integrated circuits, and more specifically, to enhancing the integration of compiler-based testing in post-silicon validation through random function selection and insertion.

Many known modern processors include high-performance central processing units (CPUs) that are configured to execute multiple parallel operations simultaneously. For example, some known high-performance CPUs use out-of-order execution to execute instructions in an order governed by the availability of the input data and the execution units rather than by the original program order. In addition, many such known high-performance CPUs use simultaneous multithreading (SMT) for improving the overall efficiency of superscalar CPUs (i.e., CPUs with multiple execution units thereon for executing more than one instruction during a clock-cycle) with hardware multithreading. Moreover, such CPUs may reside on a system on a chip (SoC) that is an integrated circuit that integrates all or most components of a computer or other electronic system. At least some known post-silicon validation systems and methods validate the various features of the SoCs through test generation and execution through an exerciser.

SUMMARY

A system, computer program product, and method are provided for enhancing the integration of compiler-based testing in post-silicon validation through random function selection and insertion.

In one aspect, a computer system is provided for executing a test program for a device-under-test (DUT). The system includes a validation platform, a compiler communicatively coupled to the validation platform, and a preprocessor communicatively coupled to the compiler. The preprocessor is configured to transmit a plurality of uncompiled snippets and a plurality of uncompiled micro-functions into the compiler. The compiler is configured to randomly select a portion of uncompiled micro-functions from the plurality of uncompiled micro-functions. The compiler is also configured to compile the uncompiled snippets and the portion of uncompiled micro-functions, thereby generating a plurality of compiled snippets and a compiled portion of micro-functions. The compiler is further configured to interweave, randomly, the compiled portion of micro-functions with the plurality of compiled snippets, thereby at least partially generating a test program for the DUT. The validation platform is configured to execute one or more post-silicon validation tests for the DUT with the test program. The system enhances the integration of compiler-based testing in post-silicon validation through random function selection and insertion.

In another aspect, a computer readable storage medium is presented. The computer readable storage medium includes computer executable instructions that when executed by at least one computing device executes a test program for a device-under-test (DUT). The computer readable storage medium includes instructions to transmit a plurality of uncompiled snippets and a plurality of uncompiled micro-functions into a compiler. The computer readable storage medium also includes instructions to select, randomly, a portion of uncompiled micro-functions from the plurality of uncompiled micro-functions. The computer readable storage medium further includes instructions to compile the uncompiled snippets and the portion of uncompiled micro-functions, thereby generating a plurality of compiled snippets and a compiled portion of micro-functions. The computer readable storage medium also includes instructions to interweave, randomly, the compiled portion of micro-functions with the plurality of compiled snippets, thereby at least partially generating a test program for the DUT. The computer readable storage medium further includes instructions to execute one or more post-silicon validation tests for the DUT with the test program. The computer readable storage medium enhances the integration of compiler-based testing in post-silicon validation through random function selection and insertion.

In yet another aspect, a computer-implemented method is provided for executing a test program for a device-under-test (DUT). The method includes transmitting a plurality of uncompiled snippets and a plurality of uncompiled micro-functions into a compiler. The method also includes selecting, randomly, a portion of uncompiled micro-functions from the plurality of uncompiled micro-functions. The method further includes compiling the uncompiled snippets and the portion of uncompiled micro-functions, thereby generating a plurality of compiled snippets and a compiled portion of micro-functions. The method also includes interweaving, randomly, the compiled portion of micro-functions with the plurality of compiled snippets, thereby at least partially generating a test program for the DUT. The method further includes executing one or more post-silicon validation tests for the DUT with the test program. The method enhances the integration of compiler-based testing in post-silicon validation through random function selection and insertion.

The present Summary is not intended to illustrate each aspect of, every implementation of, and/or every embodiment of the present disclosure. These and other features and advantages will become apparent from the following detailed description of the present embodiment(s), taken in conjunction with the accompanying drawings.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are illustrative of certain embodiments and do not limit the disclosure.

Figure 1:
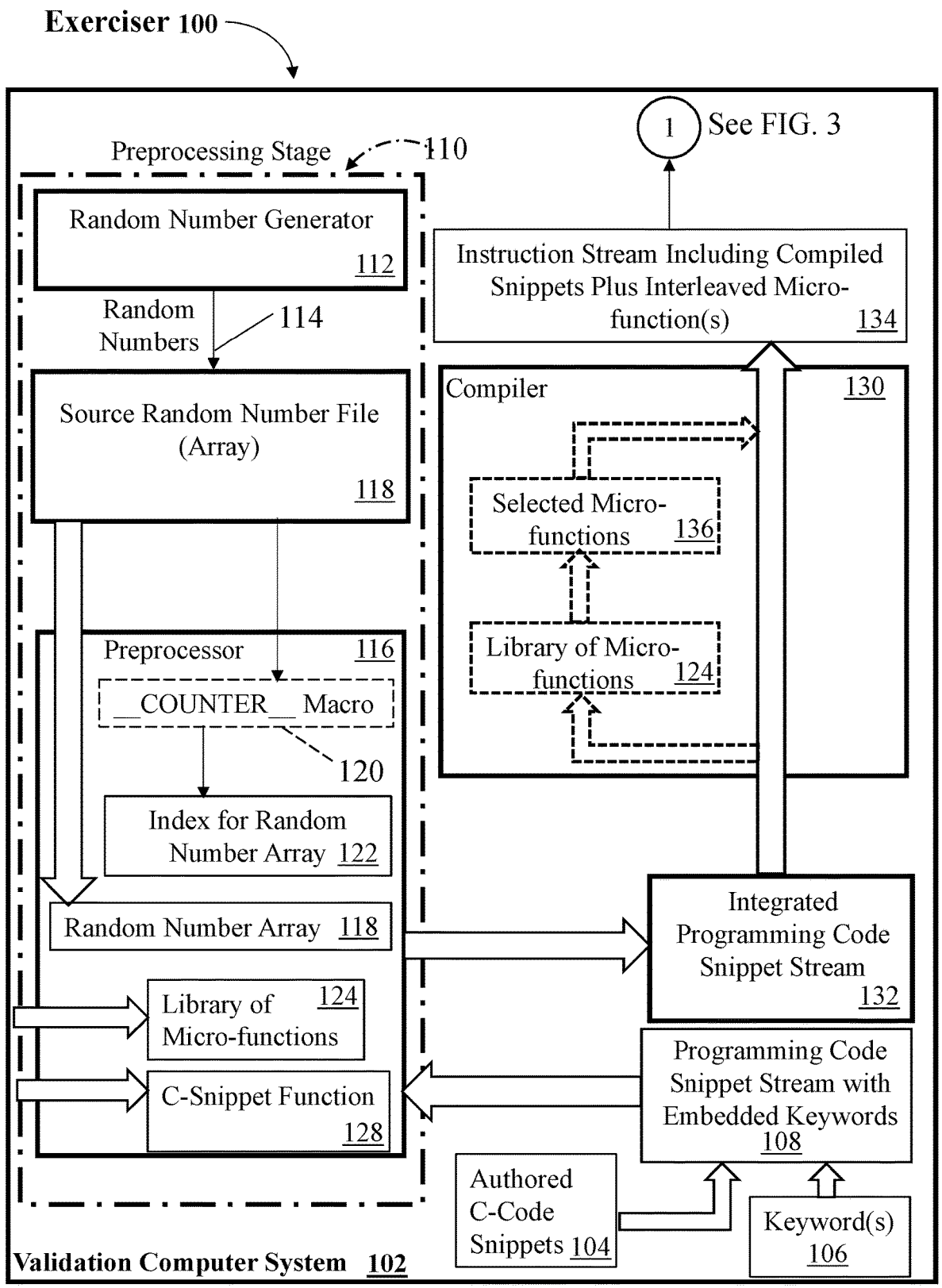
FIG. 1 is a block schematic diagram of a portion of an exerciser including a validation computer system, in accordance with some embodiments of the present disclosure.

While the present disclosure is amenable to various modifications and alternative forms, specifics thereof have been shown by way of example in the drawings and will be described in detail. It should be understood, however, that the intention is not to limit the present disclosure to the particular embodiments described. On the contrary, the intention is to cover all modifications, equivalents, and alternatives falling within the spirit and scope of the present disclosure.

DETAILED DESCRIPTION

Aspects of the present disclosure relate to implementing a system, medium, and method for enhancing the integration of compiler-based testing in post-silicon validation through random function selection and insertion. While the present disclosure is not necessarily limited to such applications, various aspects of the disclosure may be appreciated through a discussion of various examples using this context.

It will be readily understood that the components of the present embodiments, as generally described and illustrated in the Figures herein, may be arranged and designed in a wide variety of different configurations. Thus, the following details description of the embodiments of the apparatus, system, method, and computer program product of the present embodiments, as presented in the Figures, is not intended to limit the scope of the embodiments, as claimed, but is merely representative of selected embodiments.

Reference throughout this specification to "a select embodiment," "at least one embodiment," "one embodiment," "another embodiment," "other embodiments," or "an embodiment" and similar language means that a particular feature, structure, or characteristic described in connection with the embodiment is included in at least one embodiment. Thus, appearances of the phrases "a select embodiment," "at least one embodiment," "in one embodiment," "another embodiment," "other embodiments," or "an embodiment" in various places throughout this specification are not necessarily referring to the same embodiment.

The illustrated embodiments will be best understood by reference to the drawings, wherein like parts are designated by like numerals throughout. The following description is intended only by way of example, and simply illustrates certain selected embodiments of devices, systems, and processes that are consistent with the embodiments as claimed herein.

As used herein, "facilitating" an action includes performing the action, making the action easier, helping to carry the action out, or causing the action to be performed. Thus, by way of example and not limitation, instructions executing on one processor might facilitate an action carried out by semiconductor processing equipment, by sending appropriate data or commands to cause or aid the action to be performed. Where an actor facilitates an action by other than performing the action, the action is nevertheless performed by some entity or combination of entities.

Many known modern processors, e.g., processing devices such as central processing units (CPUs), include integrated circuitry therein to execute the desired functionality through one or more computational functional units and logical functional units. In addition, many known hardware designs and fabrication processes include two distinct testing phases, i.e., pre-silicon verification testing and post-silicon validation testing, both of which are described further herein. Many known processor hardware verification and validation systems and methods are configured to test semiconductor integrated circuits prior to and after fabrication of the respective integrated circuits.

Verification tools used for the manufacturing of hardware processors validate the desired behavior of the hardware given specific system conditions. For example, prior to fabrication, i.e., pre-silicon, software-based verification tools are employed to test the integrated circuit designs and features through pre-silicon verification test generation. The pre-silicon verification testing of an ultra-high fidelity model of an integrated circuit design is performed on a computer-implemented simulation and testing platform that can leverage an operating system and testing software, i.e., testing tools in a virtual environment with sophisticated simulation, emulation, and formal verification tools. Such tools include, e.g., and without limitation, complex constraint satisfaction problems (CSPs) and a reference model. CSPs are mathematically based devices defined as a set of objects whose state satisifies a number of constraints and limitations. At least some of the known post-silicon validation systems and methods use one or more CSP solver algorithms to solve the previously described CSPs. A reference model is an architecturally accurate simulation of the integrated circuit, including the ability to emulate the intended behaviors of the integrated circuit as a result of each of the instructions such as, without limitation, the state of the processor before and after the execution of each instruction. Therefore, the integrated software is tested with the respective software to verify the integrated functionality thereof. The results of the pre-silicon verification testing may be used to make adjustments to the design of the integrated circuit, including hardware and software design. Accordingly, prior to testing physical prototypes of integrated circuits, a software simulation is performed to verify the design and functionality thereof.

Once the engineers are satisfied with the quality of the hardware design in a virtual environment, one or more prototypes will be fabricated, i.e., a post-silicon product will be fabricated. The post-silicon product or prototype may be referred to as a circuit, a silicon, a processor, and as a hardware device, where the term "physical integrated circuit prototype" is used herein. Upon fabrication of a physical integrated circuit prototype subsequent to the pre-silicon verification testing, the prototype is physically tested to operationally stress the device and capture any deficiencies not captured during the pre-silicon verification testing. The evolution of post-silicon validation testing is at least partially described through publications such as, and without limitation, "Random Test Generators for Microprocessor Design Validation" (J. Storm, 2006) and "Treadmill: A post-silicon exerciser for multi-threaded processors" (A. Adir et al, 2011).

The post-silicon validation testing is executed through a validation platform, and more specifically, in some embodiments, through one or more bare-metal hardware exercisers. In some embodiments, any tools that enable operation of the post-silicon validation testing as described herein are used in conjunction with the bare-metal hardware exercisers. Such tools include, without limitation, reuse of a portion of the tests performed in the pre-silicon testing as generated by the pre-silicon testing tools, manually written tests, lightweight operating systems, and production workloads. Accordingly, in some embodiments, the bare-metal hardware exercisers may be used to complement other testing tools.

Bare-metal hardware exercisers are programs that run on the physical integrated circuit prototype, i.e., the device-under test (DUT), continuously generate the test cases (referred to as test programs herein), execute the test programs, and verify the results of the test programs. In general, to facilitate high silicon utilization within the DUT, the exerciser's software should be lightweight and simple, which is contrasted with complex test generation and extensive, complex computation. In accordance with the lightweight and simple requirements, the post-silicon validation testing may be executed without the aid of an operating system; therefore, the testing is executed bare-metal with simple exerciser software. Accordingly, the exerciser runs on hardware, for example, the DUT. In some embodiments, one or more analyzers or analysis devices, e.g., without limitation, oscilloscopes, are coupled to the DUT to collect operational data or to aid the debugging process.

In at least some embodiments, the exercisers include an off-line portion that generates exerciser images and an on-line portion that executes test exercises. Specifically, an off-line portion of the exerciser, i.e., an exerciser image builder, creates the exerciser images, which will be run on-line on the DUT, where continuously generated test programs (sometimes referred to as test cases herein) are executed and the results are checked. In some embodiments, the test programs are generated from respective test templates that specify the desired (targeted) test scenarios directed to specific features of the DUT from a verification plan. Each test template includes a sequence of statements, where the sequence of statements is randomly generated and placed in an order of execution that will be followed during the validation testing, and at least a portion of the statements include some ambiguity that will be exploited as discussed further. Based on each statement, a number of instructions for the respective portion of the test program are generated and are added to the test program. Therefore, for each statement in the sequence of statements, a set of instructions is generated and added to the test program. The instructions are generated on a statement-by-statement basis in the order of placement in the test template until the statements are exhausted and a complete first test program is generated based on the test template and the sequence of statements therein.

The first test program is executed on the DUT. Once the first test program has completed execution, the generation process for the second test program proceeds. Since at least a portion of the statements include ambiguities, a second set of instructions is generated for each such statement, where the second set of instructions are at least slightly different from the first set of instructions. Therefore, the second test program is at least slightly different from the first test program. As the varying instructions are generated from the statements with ambiguities, such instruction generation may be randomized within established parameters, i.e., and without limitation, one of the multiple varying instructions for a particular statement may be selected randomly. However, the order of the selected instructions will be consistent with the order of the statements in the test template. The second test program is executed on the DUT. The test program generation and the test program execution are performed iteratively until an established stopping point is reached. Such stopping points, in some embodiments, include, without limitation, exhaustion of every possible iteration of the instructions that may be generated from the respective statements, and in some embodiments, exhaustion of the desired number of exerciser images and/or exhaustion of time limits for the respective exerciser images. In some embodiments, multiple test templates may be used and the described process is used for each test template. Accordingly, the generation and execution of the test programs has some randomness intrinsically established therein, thereby facilitating robust testing of the DUT.

At least one known mechanism for introducing randomness into post-silicon testing is described in U.S. Patent Application Publication No. 2011/0087861. Specifically, a high-throughput, post-silicon validation methodology that uses crafted randomized tests with known final outcomes. Tests are generated in such a way that at the end of the execution, the initial state of the machine is restored. Therefore, the final state of such a reversible program is known a priori and, a simulation phase of the validation process is bypassed. The framework may use a program generation algorithm that is agnostic to any particular instruction set, thereby allowing the program generation algorithm to be easily ported between processors with different instruction and feature sets. The respective method includes identifying one or more initial operations from one or more instructions of the instruction set architecture (ISA) of the processor. The method also includes determining one or more inverse operations, each corresponding to one of the initial operations. The method further includes generating a verification test comprising one or more stacks, where each stack is assigned to alter a register on the processor, and each stack is configured to a different pair of initial operations and inverse operations. If there are a plurality of stacks, the stacks are interleaved with each other, and each stack applies its initial operation to its register and then applies its inverse operation in the reverse order to its register such that the application of the inverse operation returns the register to a state before application of the initial operation of the stack. Notably, as described further herein, post-silicon testing has continued to evolve as the DUTs have evolved.

Many known modern processors include high-performance central processing units (CPUs) that are configured to execute multiple parallel operations simultaneously. For example, some known high-performance CPUs use out-of-order execution to execute instructions in an order governed by the availability of the input data and the execution units rather than by the original order in a program. One of the benefits of out-of-order processing includes reducing the time periods where the processor may be idle while waiting for the preceding instruction to complete. The processor can, in the meantime, process the next instructions that are able to run immediately and independently, thereby facilitate making use of instruction cycles that would otherwise be wasted. In addition, many such known high-performance CPUs use simultaneous multithreading (SMT) for improving the overall efficiency of superscalar CPUs (i.e., CPUs with multiple execution units thereon for executing more than one instruction during a clock-cycle) with hardware multithreading. SMT permits multiple independent threads of execution to better utilize the resources provided by modern processor architectures. Moreover, a further example of the highly parallel nature of modern high-performance CPUs is the use of certain independent execution units on the CPU configured for specific data types, i.e., floating-point (FP) data types, geoprocessing (GP) data types, and vector data types.

In addition to the parallel nature of modern high-performance CPUs, such CPUs may sit on a system on a chip (SoC) that is an integrated circuit that integrates all or most components of a computer or other electronic system. These components typically include one or more of the previously described high-performance CPUs, memory, input/output (I/O) ports, and secondary storage, often alongside other components such as radio modems and a graphics processing unit (GPU), all on a single substrate or microchip. The device may contain digital, analog, mixed-signal, and radio frequency signal processing functions. Accordingly, modern SoCs are substantially heterogeneous and such SoC may be the DUT, where the validation tests will be generated to induce stimuli to test all of the components and interfaces, including, without limitation, memory coherence. Memory coherence is a scheme (i.e., a memory coherence protocol) used on multicore devices with two or more processors that may share one or more common areas of memory to notify all of the processing elements of changes to any shared values in the shared memory areas.

As discussed above, at least some of the known post-silicon validation systems and methods combine the use of the test templates, testing knowledge, and test randomness to validate the various features of the DUT through the generation and execution of the test exercises. Also, as described above, the test generation is typically executed though a statement-by-statement instructions generation process subject to the order of statement positioning within the test template. Therefore, many known known post-silicon validation systems and methods cannot generate realistic validation tests that will use the many registers for the various data types and exercise the intrinsic parallelism of the DUTs being validated. In addition, some CPUs are optimized for processing the instructions generated by a compiler, which are typically more complex than the unstructured code used in many known post-silicon validation systems and methods, and therefore the respective features do not get tested, e.g., and without limitation, loop counter prediction and vector computations. In some embodiments, many of the planned testing schemes may be of high complexity, thus making the test generation a complex task. More specifically, in at least some embodiments of these known systems and methods, the desired test conditions are manually integrated into the test programs, thereby manually increasing the complexity of generation of the test programs.

Moreover, some known systems and methods for conducting post-silicon validation testing include the use of a compiler embedded in the exerciser. i.e., in either the off-line portion or the on-line portion. Loading a compiler into the exerciser facilitates executing a method for off-DUT creation of compiler generated code snippets (in machine language) as a means of augmenting the test generator and the generated tests, thereby enabling complex test scenarios which stimulate the entire width of the testing pipeline into, and through, the DUT as well as any special engines or accelerators native to the DUT. Moreover, similar results may be found in loading a compiler into the DUT for on-DUT creation of the compiler generated code snippets. The compiler, whether positioned off-DUT or positioned on-DUT, includes vectorization and optimization that are well known mechanisms in the compilers domain.

The vectorization features, sometimes referred to as automatic vectorization, in parallel computing, is a case of automatic parallelization, where a computer program is converted from a scalar implementation, which processes a single pair of operands at a time, to a vector implementation, which processes one operation on multiple pairs of operands at once. For example, automatic vectorization may rewrite a loop so that instead of processing a single element of an array N times, it is now possible to process 4 elements of the array simultaneously N/4 times. Such parallelization features of the compiler facilitate testing the intrinsic parallelism of the DUTs being validated. The optimization features facilitate the compiler transforming a piece of code into another functionally equivalent piece of code for the purpose of improving one or more of the original code's characteristics. In at least some respects, two useful characteristics for the code are the speed and size thereof. Such automatic optimization reduces the need for programmers or other computer technicians to manually revise a program. The use of such compilers in the validation process facilitates generating extremely complex machine code from higher-level language code, even the simplest C-programs, for example, and creating intrinsic parallelization opportunities for the CPU's out-of-order processing features. In addition, the compilers may be configured to generate snippets of machine code from snippets of the higher-level language C-code to test specific features at random, thereby enhancing the respective testing through random biased test generation via the compiled snippets.

Many of the embodiments described herein are implemented through the C programming language. In some embodiments, any one or more programming languages are used to enable operation of the embodiments described herein.

In addition to the parallelization features, the use of a memory manager to perform memory allocation facilitates reserving only as much memory as needed to test Memory Management Units (MMUs) (not shown) on the DUT. Accordingly, the use of a compiler in the validation system and methods facilitates using the features of the exercisers that are natively parallel such that memory allocation and translation may be exercised aggressively to identify defects on the DUT in a disruptive manner.

In some embodiments, as mentioned above, transmission of C-code (prior to compiling, sometimes referred to as C-code snippets, C-snippets, C-functions, and programming code snippets) through the compiler may be performed through the use of compiled snippets, i.e., snippets of compiled C-code that may be used to generate small modular function templates that use the same parameters as the exerciser. In some embodiments, any higher-level programming language that enables operation of the systems described herein through the methods described herein is used. The compiler may be either off-line, that is, positioned off-DUT, or may be loaded into the memory, i.e., positioned on-DUT.

In addition, memory allocation by the exerciser is executed through installing a memory manager and a memory allocator in the exerciser image builder and a memory access generator in the exerciser image to randomly allocate memory sections within the DUT in conjunction with the insertion of test instructions and the insertion of the compiled snippets. The random memory section allocations are at least partially based on requirements embedded in the test templates and are directed towards the respective portions of the DUT memory. The respective data in the portions of the memory allocated may be designated as invalid and secure to increase the level of difficulty in processing the data, thereby further stressing the DUT. In addition, many of the attributes of the data may be changed on the DUT to also stress the DUT further.

Furthermore, the introduction of structured compiler-based code into the test stream includes substantially seamless integration of the compiler-generated code into existing tests. Moreover, the use of the compiled C-code allows the use of recursive testing, including calling another language through the test templates, e.g., and without limitation, Extensible Markup Language (XML), where the compiled snippet code may be invoked and translated into XML to implement the respective instructions in real-time, thereby further enhancing the validation of the DUT and enhancing the biased test generation associated with the exerciser with the structured compiled instructions. Furthermore, integrating compilers into the validation testing facilitates automatically increasing the coverage of the testing through issuing hundreds of parallel instructions in a non-blocking order, without manual complication of the templates and adding verification value to the existing templates.

Accordingly, the test programs generated automatically through known validation techniques are enhanced through the use of compiler-generated instructions to augment the existing instructions through either an off-DUT or on-DUT creation of compiled C-code snippets, i.e., compiled C-snippets. The enhancement is at least partially based on the compiler creating an instruction stream which has a structure and inserts optimizations to exploit parallel processing units in the CPU that utilize the entire processor, for example loop counter prediction or vector computations, in contrast to a random biased method which is used in an exerciser. In addition, the existing random memory allocation features further enhance the use of the compiled instructions to fully utilize the testing and DUT pipeline, including any special engines and accelerators, if present. Moreover, as the randomly selected C-functions are used in combination with the test template to generate many more test programs per template, such a configuration thereby allowing the exerciser to utilize the many cycles it is given. The C-functions incorporate a type of runtime randomization that dictates the specifics of each test program. Two such examples include whether some cycles are expended to validate each operation is executed correctly, or for the testing system to wait for the result of the present testing. Notably, as each random decision is implemented, the respective test space is effectively increased.

Executing the validation exercises though implementing these features facilitate the exerciser to run for billions of cycles, thereby allowing for a potentially significantly large amount of test programs. However, the exerciser is forced to repeat many of the same test programs due to a small test space that the exerciser can generate for a respective template. Accordingly, while the randomly inserted C-functions increase the test space, the randomly inserted C-functions can still be exhausted with the billions of test cycles given, and additional testing options to further expand the test space would further enhance the execution of validating DUTs.

A system, computer program product, and method are disclosed and described herein for conducting post-silicon validation testing through the use of an existing compiler embedded in the exerciser, i.e., in either the off-line portion or the on-line portion. In at least some embodiments, one or more micro-functions (sometimes referred to as µ-functions) of C-code are integrated with, i.e., interleaved with the existing validation instructions. These micro-functions facilitate stressing the respective DUT with only a few additional testing instructions randomly injected therein without interfering with the initial testing scheme. In general, the micro-functions are short and self-contained. In some embodiments, an unused portion of one or more cache lines and available registers (e.g., floating point registers (FPRs) and general point resisters (GPRs)) are used to facilitate the use of the micro-functions. In some embodiments, additional co-processors may be used as well. The injection of micro-functions into the stream of validation instructions can increase the number of testing scenarios by a factor of the number of micro-functions times the number of C-functions times the number of places in which the micro-functions are actually inserted times the number of compiler optimizations employed. Accordingly, the number of different validation programs created may be expanded from thousands up to tens of thousands, and in some embodiments, beyond.

However, selecting the micro-functions in runtime employs more cycles than the actual micro-function itself which significantly reduces the effectiveness of the called micro-functions in improving the overall effectiveness of the validation testing. Therefore, as described further herein, choosing each micro-function during compilation allows the compiler to insert each micro-function in the instruction stream directly without generating any program execution branches. As used herein, the term "branches" refers to branch instructions in a computer program that can cause the validation system to begin executing different instruction sequences and thus deviate from its present tasking of executing the DUT validation instructions in order. In a worst-case scenario, for a large number of branches, the original program will have completed its execution prior to the execution of all of the branches. In addition, execution of the branch instructions requires the use of resources, e.g., registers, that may otherwise be used for execution the original DUT validation instructions.

In at least some embodiments, a programmed (i.e., scripted) preprocessing stage is employed to generate a large array of random numbers in a file. In some embodiments, each random number is unique with no duplicates in the array. Further, in some embodiments, the preprocessing stage includes a preprocessor, which is sometimes referred to as a precompiler herein. The file created is a source file containing the random numbers, i.e., the numbers are arranged in an array randomly, such that the preprocessor has access to truly random numbers that will be compiled with the rest of the validation instructions. In some embodiments, a predefined preprocessor macro such as _COUNTER_ is used to facilitate indexing of the random numbers in the array of random numbers file. Each occurrence of a consecutive incrementation along the index (starting at zero and consecutively increasing by one integer therefrom) results in a pointer directed to a different place in the random number array such that a different random number is selected for each different index value. The incrementing of the index values facilitates iterations as described further herein.

In one or more embodiments, a library of micro-functions is injected into the preprocessor. In addition, a C-snippet function (sometimes referred to herein as a switch function and/or a switch statement, and discussed further herein) and the array of random numbers are injected into the preprocessor. In general, a switch function facilitates a variable to be tested for equality against a list of values, where each value is referred to as a case, and the variable being switched on in the embodiments described herein includes the respective micro-functions. Each case is associated with a respective micro-function, and the random number elements are used to select the cases. As such, each random number element within the random number array is associated with a single micro-function within the library of micro-functions through the relationships between the cases, the random number elements, and the micro-functions. The random numbers (and the associated index values), the library of micro-functions, and the associated switch function are discussed further herein. In addition, any C-snippet function that enables operation of the embodiments described herein may be used.

In one or more embodiments, the programming code snippets, that include the authored C-code as previously discussed, is injected with one or more keywords in a random manner to form a programming code snippet stream with the randomly embedded keywords. For example, in some embodiments, the keyword "RND" is injected randomly multiple times into the authored C-code. This programming code snippet stream with the randomly embedded instances of the keyword RND is transmitted to the preprocessor. For each instance of the keyword RND in the snippet stream entering the preprocessor, the next consecutive index number is selected for precompilation. As such, the precompiled index number, the random number array, and library of the micro-functions (both in their entirety), and the switch function, are injected into the programming code snippet stream that includes the authored C-code to create an integrated programming code snippet stream for every instance of the keyword RND entering the preprocessor, thereby creating an iteration of the preprocessing stage.

In at least some embodiments, the integrated programming code snippet stream is transmitted to the compiler to compile the incoming C-code into the respective machine language for executing the respective validation exercises. In some embodiments, an assembler is also used to generate assembly language; however, the embodiments described herein exclude the use of an assembler for clarity. In some embodiments, for each instance of the switch function entering the compiler, the switch function (which is authored in C-code, hence the references herein to the C-snippet function) is compiled to execute the switch function to select the micro-functions to compile and interleave with the authored snippets, while the remaining micro-functions of the library of micro-functions are discarded.

The C-snippet function is compiled by the compiler, and embedded RND instructions initiate execution of the respective random micro-function selections. In addition, the C-snippet function uses the precompiled index number that has been compiled, through the compiler, into the respective random number from the random number array (also now resident within the compiler). The random number is used to determine the case number, where the case number for the C-snippet function is used to select the respective micro-function from the library of micro-functions (also resident in the compiler). However, rather than compiling all of the micro-functions in the library, only those micro-functions indicated for further calling (through the C-snippets function) and interleaving with the authored C-code are compiled. The index number, the random number array, the C-snippet function code, and the unselected micro-functions are discarded with no further action thereon. The authored C-code and the interleaved micro-functions are compiled together for the subsequent validation exercises of the DUT, i.e., the selected compiled micro-functions are interleaved with the authored C-code to define an instruction stream including the compiled snippets plus the interleaved one or more micro-functions. Accordingly, each instance of the codeword RND entering the preprocessor results in an iteration of a different random selection of micro-functions to be interleaved with the rest of the authored C-code snippets to create a validation instruction stream, where duplication of subsequent portions of the interleaved instruction stream is quite unlikely, thereby enhancing the complexity and the robustness of the validation of the DUT.

In addition, in at least some embodiments, the employment of random numbers is extended to the micro-functions themselves to further enhance the randomization of the validation processes. For example, and without limitation, if a micro-function is configured to execute an operation of copying a block of memory, the number of bytes of the memory block to copy are randomized per invocation of the same micro-function. Such use of the random numbers with respect to the selected micro-functions is executed in a manner similar to that for the authored C-code snippets through the preprocessor, including the random number array and the _COUNTER_ macro. Accordingly, further randomization of the validation test programs is facilitated.

In many of the embodiments described herein, there are a number of mechanisms for the compiler to leverage injecting the micro-functions into the instruction stream without generating branches or a function call, which, as described previously, is to the advantage of the DUT testing. For example, in some embodiments, one advantage is the reordering of memory accesses between the micro-functions and the principal validation testing instructions. In some embodiments, a second advantage is using the same testing resources, e.g., memory and registers for the micro-functions and the principal validation testing instructions. In some embodiments, a third advantage is using an entirely different set of registers than that of the principal validation instructions, thereby filling the instruction pipeline in a way most known validation test generators find very difficult to do automatically. Accordingly, the systems, computer program products, and methods described herein facilitate automatically and randomly selecting one or more micro-functions out of a given inventory of micro-functions during compilation time to create a cross product with the user-defined test programs.

Referring to FIG. 1, a block schematic diagram is presented illustrating a computer system 100 including a validation computer system 102, in accordance with some embodiments of the present disclosure. In at least some embodiments, the computer system 100 is an exerciser, therefore the terms computer system 100 and exerciser 100 are used interchangeably herein. The validation computer system 102 is principally employed as the off-DUT portion of the exerciser 100 for test program generation.

In at least some embodiments, the validation computer system 102 receives authored code implemented through a higher-level language, e.g., and without limitation, the C programming language, thereby generating authored C-code snippets 104. In some embodiments, the authored C-code snippets 104 include a selection of programming code snippets, where in some instances, the selection is at least partially guided by a statement in a test template (discussed further herein), where such selection of snippets are called. Keywords 106. also generated as C-code, are injected into the authored C-code snippets 104 to generate a programming code snippet stream 108 with embedded keywords. For example, in some embodiments, the keyword 106 "RND" is injected randomly multiple times into the authored C-code snippets 104. Accordingly, the terms "keyword 106" and "keyword RND 106" are used interchangeably herein.

In some embodiments, the validation computer system 102 includes a preprocessing stage 110. The preprocessing stage 110 is a programmed (i.e., scripted) artifact that includes a random number generator 112. The random number generator 112 is configured to generate a plurality of random numbers, i.e., random number elements 114. In some embodiments, each random number is unique with no duplicates. The preprocessing stage 110 also includes a preprocessor 116 (sometimes referred to as a precompiler herein). The random number elements 114 are transmitted to the preprocessor 116 through a source random number file, also referred to as the random number array 118. The random number array 118 is a source file containing the random number elements 114. The preprocessor 116 is configured to receive the random number elements 114 as the random number array 118, such that the preprocessor 116 has access to truly random numbers that will be compiled with the rest of the validation instructions. Accordingly, the preprocessing stage 110 is employed to generate a large array of random numbers in a file, i.e., the random number array 118.

In at least some embodiments, the preprocessor 116 includes a predefined preprocessor macro such as _COUNTER_ macro 120 that is configured to facilitate indexing of the random numbers in the random numbers array 118. An index 122 for the random number array 118 is created where each occurrence of a consecutive incrementation along the index 122 (starting at zero and consecutively increasing by one integer therefrom) results in a pointer directed to a different place in the random number array 118 such that a different random number elements 114 is selected for each different index value. The incrementing of the index values facilitates iterations as described further herein.

In some embodiments, the preprocessor 116 is configured to receive a library of micro functions 124. The micro-functions from the library 124 are created in C-code are configured to be integrated with, i.e., interleaved with the existing validation instructions as will be generated from the authored C-code snippets 104. These micro-functions from the library 124 facilitate stressing the respective DUT with only a few additional testing instructions randomly injected therein without interfering with the initial testing scheme. In general, the micro-functions are short and self-contained. In some embodiments, an unused portion of one or more cache lines and available registers (e.g., floating point registers (FPRs) and general point resisters (GPRs), neither shown) are used to facilitate the use of the micro-functions from the library 124. In some embodiments, additional co-processors may be used as well.

In some embodiments, the preprocessor 116 is configured to receive a C-snippet function 128 (sometimes referred to as a switch function and a switch statement herein). In general, the C-snippet function 128 facilitates a variable to be tested for equality against a list of values, where each value is referred to as case, and the variable being switched on in the embodiments described herein includes the respective micro-functions from the library 124. The C-snippet function 128 and the library of micro-functions 124 are associated with each other as described further herein. In addition, any C-snippet function that enables operation of the embodiments described herein may be used. The preprocessor 116 is configured to generate an integrated programming code snippet stream 132 (as discussed herein).

In at least some embodiments, the validation computer system 102 includes a compiler 130 that is configured to receive the integrated programming code snippet stream 132. In some embodiments, the compiler 130 is resident within an external computing device (not shown), and in some embodiments, the compiler 130 is resident within a memory device (not shown in FIG. 1). The compiler 130 is further configured to generate and transmit a validation instruction stream, i.e., an instruction stream 134 that includes compiled snippets plus the interleaved micro-functions as described herein. In some embodiments, the compiler 130 is configured to automatically interleave the micro-functions and use the respective registers.

In some embodiments, the preprocessor 116 will translate the micro-functions into a constant number that is used repeatedly, and the compiler 130 will choose the corresponding micro-function during compilation and insert the call to the micro-function in the instruction stream 134 without the selection process as previously described. Also, in some embodiments, for certain instances of relatively short and self-contained (i.e., no inputs) micro-functions, the content of the micro-functions will be directly inserted into the instruction stream 134.

In operation, the programming code snippet stream 108 with randomly embedded keyword RND 106 therein is transmitted to the preprocessor 116. For each instance of the keyword RND 106 in the programming code snippet stream 108 entering the preprocessor 116. the next consecutive index number 122 is selected for pre-compilation. As such, the precompiled index number 122, the random number array 118 and library of the micro-functions 124 (both in their entirety), and the associated C-snippet function 128, are injected into the programming code snippet stream 108 that includes the authored C-code snippets 104 to create the integrated programming code snippet stream 132 for every instance of the keyword RND entering the preprocessor 116, thereby creating an iteration of the integrated programming code snippet stream from the preprocessing stage 110.

In at least some embodiments, the integrated programming code snippet stream 132 is transmitted to the compiler 130 to compile the incoming C-code into the respective machine language for executing the respective validation exercises. In some embodiments, an assembler is also used to generate assembly language; however, the embodiments described herein exclude the use of an assembler for clarity. In some embodiments, for each instance of the C-snippet function 128 entering the compiler, the C-snippet function 128 is compiled to execute the C-snippet function 128 to select the micro-functions 136 from the library of micro-functions 124 to compile and interleave with the authored snippets, while the remaining micro-functions of the library of micro-functions 124, and the logic associated with the C-snippet function 128 itself, are discarded.

Figure 2:
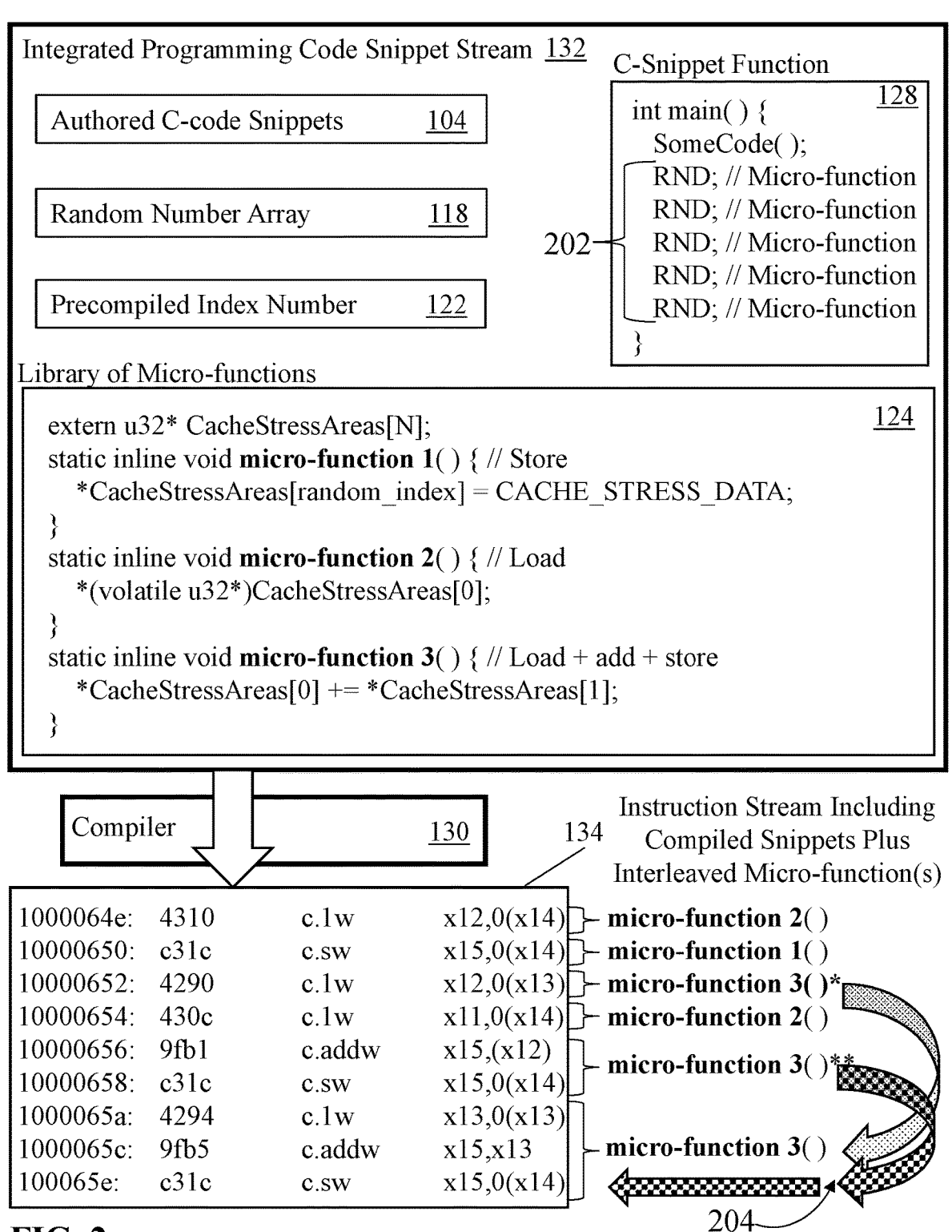
FIG. 2 is a block schematic diagram of a portion of a code scheme used within the validation computer system, in accordance with some embodiments of the present disclosure.

Referring to FIG. 2, a block diagram of a portion of a code scheme 200 used within the validation computer system 102 is presented, in accordance with some embodiments of the present disclosure. Also continuing to refer to FIG. 1, and the numbering scheme thereof, a portion of the integrated programming code snippet stream 132 is transmitted from the preprocessing stage 110 (only shown in FIG. 1). As previously discussed, the integrated programming code snippet stream 132 includes the portion of the programming code snippet stream 108 (only shown in FIG. 1) that includes the authored C-code snippets 104, the precompiled index number 122, the random number array 118 and library of the micro-functions 124 (both in their entirety), and the associated C-snippet function 128. The integrated programming code snippet stream 132 is transmitted to the compiler 130. The compiler 130 compiles the C-code into machine language, i.e., the instruction stream 134 including the compiled snippets plus the compiled micro-functions, where the selection of the micro-functions to be compiled are discussed further.

In some embodiments, in operation, the authored C-code snippets 104 and the C-snippet function 128 are compiled by the compiler 130. In addition, the C-snippet function 128 uses the precompiled index number(s) 122 as the case number(s) for the C-snippet function 128 to select the respective micro-function(s) from the library of micro-functions 124, where embedded RND instructions initiate selection of the respective random micro-functions.

The C-snippet function 128 is shown with a plurality of RND instructions 202 embedded therein. While five RND instructions 202 are shown, five is a non-limiting value and any number of RND instructions 202 is used that enables the validation computer system 102 as described herein. In some embodiments, the number of RND instructions 202 are limited by the author of the respective C-code, or the operator of the compiler 130 to control the size of the instruction stream 134. In some embodiments, the number of RND instructions 202 is a variable that is not selected until compile-time. In addition, the micro-functions (micro-function 1, micro-function 2, and micro-function 3) are shown in the library of micro-functions 124 as called by the first three of the RND instructions 202. Also, as shown in FIG. 2, the micro-functions 2 and 3 are each called a second time, i.e., once more, each through the last two RND instructions 202. The labeling of micro-functions 1, 2, and 3 herein and the associated callings of the RND instructions should not be construed as a predetermined association of the RND instructions with any particular micro-functions. For example, and without limitation, in at least one embodiment, the first three RND instructions call micro-function 87363, micro-function 341, and micro-function 5678, (neither shown), and not necessarily in that order.

In at least some embodiments, rather than compiling all of the micro-functions in the library 124, only those micro-functions indicated for further calling and interleaving with the authored C-code snippets 104 are compiled through using the preprocessor 116 to choose one of the precompiled index numbers 122 in the random number array 118. As such, a portion of the uncompiled micro-functions (e.g., micro-functions 1, 2, and 3) from the plurality of uncompiled micro-functions from the library 124 are randomly selected.

The index number 122, the random number array 118, and the unselected micro-functions in the library 124 are discarded with no further action thereon. The authored C-code snippets 104 and the selected micro-functions, i.e., micro-functions 1, 2, and 3, are compiled together for the subsequent validation exercises of the DUT, i.e., the selected compiled micro-functions 1, 2, and 3 are interleaved, randomly, with the authored C-code (not shown in the instruction stream 134 to emphasize the micro-functions 1, 2, and 3) to define the instruction stream 134 including the compiled snippets plus the interleaved one or more micro-functions 1, 2, and 3. Accordingly, each instance of the codeword RND entering the preprocessor results in an iteration of a different random selection of micro-functions from the library 124 to be interleaved with the rest of the authored C-code snippets 104 to create the instruction stream 134, where duplication of subsequent portions of the interleaved instruction stream is quite unlikely, thereby enhancing the complexity and the robustness of the validation of the DUT.

In some embodiments, the placement of the compiled micro-functions 1, 2, and 3 is reordered by the compiler 130, i.e., arranged in an alternate sequence from their sequence in the library 124 on a resource dependency basis, or alternatively, based on a lack thereof. As shown in the instruction stream 134, the micro-function 2 is the first to be interleaved within the instruction stream 134, followed by the micro-function 1, a first portion of the micro-function 3 (as indicated with a single asterisk (*)), a repeat of the micro-function 2, a second portion of the micro-function 3 (as indicated with a double asterisk (**)), and a complete instance of the micro-function 3 (as indicated by the ribbons 204). Also, in some embodiments, more complex micro-functions that have multiple portions, e.g., micro-function 3, are rearranged such that the respective portions are not only positioned in the instruction stream randomly, but also positioned in a particular sequence. Such random ordering and reordering of the selected micro-functions further enhance the complexity and robustness of the DUT validation exercises.

In many of the embodiments described herein, there are a number of mechanisms for the compiler 130 to leverage injecting the micro-functions 1, 2, and 3 into the instruction stream 134 without generating branches, which, as described previously, is to the advantage of the DUT testing. For example, in some embodiments, one advantage is the reordering of memory accesses between the micro-functions 1, 2, and 3 and the principal validation testing instructions (discussed further herein). In some embodiments, a second advantage is using the same testing resources, e.g., memory and registers for the micro-functions 1, 2, and 3 and the principal validation testing instructions. In some embodiments, a third advantage is using an entirely different set of registers than that of the principal validation instructions, thereby filling the instruction pipeline in a way most known validation test generators find very difficult to do automatically. Accordingly, the systems, computer program products, and methods described herein facilitate automatically and randomly selecting one or more micro-functions out of a given inventory of micro-functions during compilation time to create a cross product with the user-defined test programs.

In some embodiments, one or more instantiation mechanisms are introduced. For example, the previously discussed random reordering of the micro-functions 1, 2, and 3 through the compiler 130 in the instruction stream 134 is used in conjunction with the compiler 130 making copies of the authored C-code snippets 104. In these embodiments, the selected micro-functions 1, 2, and 3 are randomly interleaved with the respective copies of the authored C-code snippets 104 with randomly varying sequences of the selected micro-functions 1, 2, and 3 to create different instruction streams 134 to further enhance the robustness of the validation testing through varying the instructions, while maintaining the intent and results of the respective test programs 472 (see FIG. 4) through all of the iterations of the copies. Therefore, each test program 472 has a different sequence of the interleaved micro-functions 1, 2, and 3. Accordingly, in some embodiments, a plurality of test programs 472 are generated through randomly varying sequences of an interleaved first portion of compiled micro-functions (i.e., the selected micro-functions 1, 2, and 3) in each copy of a plurality of copies of a first selection of the plurality of compiled snippets.

In some embodiments, the results of each test program 472 with the varying sequences of the micro-functions 1, 2, and 3 are compared to validate the respective operations. In some embodiments, the number of copies of the authored C-code snippets 104 is selected at random by the compiler 130. In some embodiments, a plurality of instantiated test programs 472, each determining a different test path, may be executed and compared through a single image.

In some embodiments, the compiler 130 will use the same selected micro-functions 1, 2, and 3 on a different authored-C-code snippet 104 to further vary the instruction stream 134. In some embodiments, the selected authored C-code snippet 104 is selected randomly. Therefore, in some embodiments, a plurality of test programs 472 are generated through randomly varying a sequence of an interleaved first portion of compiled micro-functions (i.e., the selected micro-functions 1, 2, and 3) in each copy of a plurality of copies of a second selection of the plurality of compiled snippets that is different from the first selection of the plurality of compiled snippets previously discussed. As such, the random multiple positioning of the selected micro-functions interleaved with one or more of the authored-C-code snippets 104 facilitates creating many more test programs 472 using the same template without expending additional resources directed toward randomization of subsequent selections of the micro-functions.

In some embodiments, rather than changing the sequence of selected micro-functions for one or more copies of one or more selected snippets, different selected micro-functions are used to further enhance the randomness and robustness of the validation testing. For example, rather than the micro-functions 1, 2, and 3, any other micro-functions (i.e., a second portion) other than those three micro-functions (i.e., a first portion) are randomly selected and compiled and interleaved with a selected compiled snippet. Specifically, the first portion of micro-functions are interleaved with a compiled snippet, and in a subsequent test, a second portion of micro-functions different from the first portion of micro-functions are interleaved with a copy of the same compiled snippet. Accordingly, the random multiple selections of micro-functions interleaved with a particular authored-C-code snippet 104 facilitates creating many more unique test programs 472.

In addition, in at least some embodiments, the employment of the random number elements 114 from the random number array 118 is extended to the uncompiled micro-functions from the library 124 to further enhance the randomization of the validation processes through using the random number elements 114 from the random number array 118 to vary the invocations of the uncompiled micro-functions from the library 124 and generate, through the compiler 130, varying invocations of the compiled micro-functions. For example, and without limitation, if a micro-function is configured to execute an operation of copying a block of memory, the number of bytes of the memory to copy are randomized per invocation of the same micro-function.

Such use of the random numbers elements 114 from the random number array 118 with respect to the selected micro-functions from the library 124 is executed through the preprocessor 116 in a manner similar to that for the authored C-code snippets 104, including the random number array 118 and the _COUNTER_ macro 120. For example, and without limitation, referring to the library of micro-functions 124 in FIG. 2, the "*CacheStressAreas[random_index] =CACHE_STRESS_DATA;" line associated with the micro-function 1 is used to employ the random selection of the index value for the micro-function 1. The index values associated with the [random_index] invocation will be associated with respective random values for the micro-function 1 calls. Accordingly, for each instance of the RND keyword, or a different keyword to further randomize the test programs 472, different invocations of the micro-function 1 will yield at least some variations in the respective test programs 472.

Figure 3:
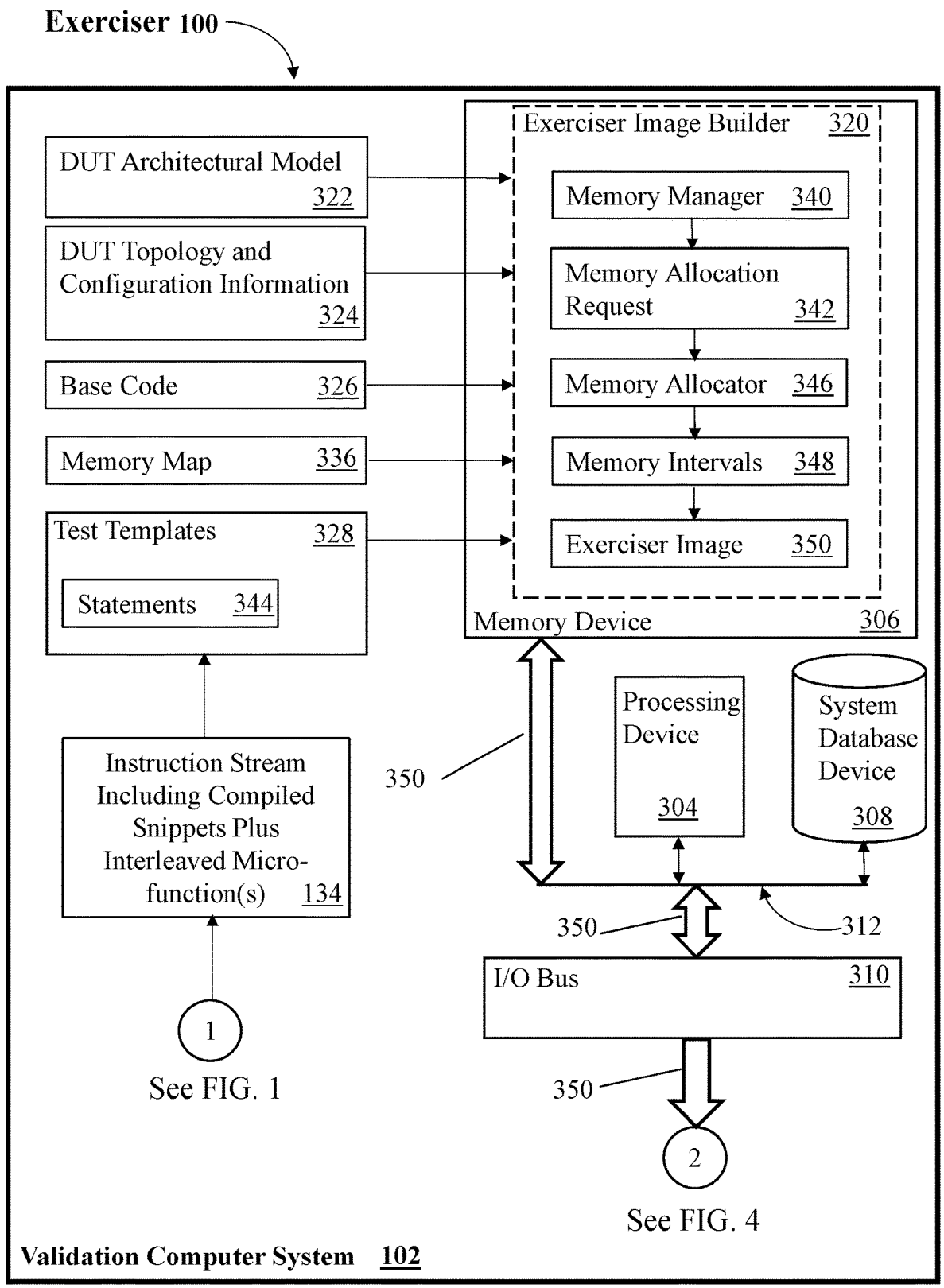
FIG. 3 is a block schematic diagram further illustrating the exerciser including the validation computer system, in accordance with some embodiments of the present disclosure.

Referring to FIG. 3, a block schematic diagram is presented further illustrating the exerciser 100 including the validation computer system 102. Continuing to also refer to FIG. 1. the validation computer system 102 further includes one or more processing devices 304 (only one shown), one or memory devices 306 (only one shown), one or more system database devices 308 (only one shown), and an input/output (I/O) bus 310 communicatively coupled together through a bus network 312. As previously discussed, the validation computer system 102 is principally employed as the off-DUT portion of the exerciser 100 for test program 472 generation.

In one or more embodiments, an exerciser image builder 320 is resident within the memory device 306. The exerciser image builder 320 may be configured to generate an exerciser image 350 that will in turn be used to generate a test stream 496 (shown in FIG. 4) for testing a device-under-test (DUT) 480 (shown in FIG. 4). The exerciser image builder 320 may be a computerized tool, such as implemented in hardware, software, or a combination thereof. The exerciser image builder 320 may be configured to receive different inputs as data from which the exerciser image 350 may be built. In some embodiments, such inputs include a DUT architectural model 322 that may be injected off-line into the exerciser image builder 320 to facilitate generating test programs 472 on-line that invoke different architectural aspects of the target device. As used herein, a "test case," i.e., a "test program 472," is a set of stimuli to the DUT 480 that may include instructions for the DUT 480 to process. The test programs 472 may further include initialization values to registers (not shown) of the DUT 480. The terms "test case" and "test program" are used interchangeably herein.

Additionally, DUT topology and configuration information 324 may be provided as an input to the exerciser image builder 320. The DUT topology and configuration information 324 may be injected off-line into the exerciser image 350 to facilitate generating test programs 472 on-line that test different aspects of the topology and configuration of the DUT 480. Further, in some embodiments, base code 326 may be provided as input, where the base code 326 may include program instructions to be added to the exerciser image 350. In some embodiments, the exerciser image 350 may be based on the base code 326. In some embodiments, the program instructions may be operative to provide predetermined operating system services and/or features to a bare-metal validation platform 490 (shown in FIG. 4). Moreover, in some embodiments, one or more test templates 328 may be provided as input to facilitate the exerciser image 350 generating the battery of validation testing that will be used to validate the DUT 480. Each of the test templates 328 include a plurality of statements 344 that are discussed further herein. The sources of the DUT architectural model 322, the DUT topology and configuration information 324, the base code 326, and the test templates 328 are any sources that enable operation of the exerciser 100 as described herein. In addition, the DUT architectural model 322, the DUT topology and configuration information 324, the base code 326, and the test templates 328 may be stored in the system database device 308.

In at least some embodiments, and as previously described, the validation computer system 102 includes the compiler 130 that transmits the instruction stream 134 including the compiled snippets plus the compiled micro-functions, where the selection of the micro-functions that were compiled was previously discussed. In some embodiments, the compiler 130 is resident within an external computing device (not shown), and in some embodiments, the compiler 130 is resident within the memory device 306. In some embodiments, the authored C-code snippets 104, the keywords 106, the random number array 118, the library of micro-functions 124, and the C-snippet function 128 are stored in the system database device 308.

In some embodiments, the selection of the authored C-code snippets 104 is guided by a statement in the test template 328. As the validation testing is being executed on the DUT 480, a test generator 474 (see FIG. 4) injects a call for the instruction stream 134. As previously described, the instruction stream 134 that is the subject of the call is based on the respective authored C-code snippet 104 that will be compiled by the compiler 130. The respective authored C-code snippet 104 is selected as a function of the present instructions being generated by the test generator 474 from the exerciser image 350, where the present instructions are associated with the particular statement in the test template 328 that are correlated to the authored C-code snippet 104. In addition, the test template 328 includes sufficient information embedded therein to prepare the appropriate parameters for the injection of the instruction stream 134 at the point of the call during the validation testing of the DUT 480 as directed by the test template 328. In some embodiments, for those instances where there is more than one authored C-code snippet 104 associated with a particular statement in the test template 328, the exerciser image builder 320 will select the respective authored C-code snippet 104 for compiling by the compiler 130 with the subsequent injection of the respective instruction stream 134 into a test program 472 (see FIG. 4) through the exerciser image 350 at run-time. The selection and compiling of the micro-functions interleaved with the authored C-code snippets are described elsewhere herein.

In at least one embodiment, another input into the exerciser image builder 320 is a memory map 336 that includes the amount of memory 462 (see FIG. 4) of the DUT 480 and its topology including, without limitation, descriptions of page boundaries, segment boundaries, and page attributes (e.g., cacheable or non-cacheable). The exerciser image builder 320 includes a memory manager 340 that is configured to generate one or more memory allocation requests 342. The memory allocation requests 342 are at least partially based on requirements embedded in the test templates 328. The exerciser image builder 320 also includes a memory allocator 346 configured to receive the memory allocation requests 342 from the memory manager 340 and randomly select memory intervals 348 from the memory 462 (see FIG. 4). The randomly selected memory intervals 348 are injected into the exerciser image 350 and are used as described further herein.

In one or more embodiments, the exerciser image builder 320 may be configured to manipulate any input provided to it before storing corresponding data in the system database device 308. In one embodiment, the exerciser image builder 320 may strip down information that is not needed by the exerciser image 350 and/or may pre-calculate information to reduce the amount of data to be retained in the exerciser image 350. Also, in at least some embodiments, the exerciser image 350 may include, or retain, additional useful information such as data and metadata associated with the DUT architectural model 322, the DUT topology and configuration information 324, the base code 326, the test templates 328, and the memory map 336 based upon generation of present and previous test cases. Accordingly, the exerciser image builder 320 includes sufficient data to build the exerciser image 350 that will be used to test the DUT 480.

Figure 4:
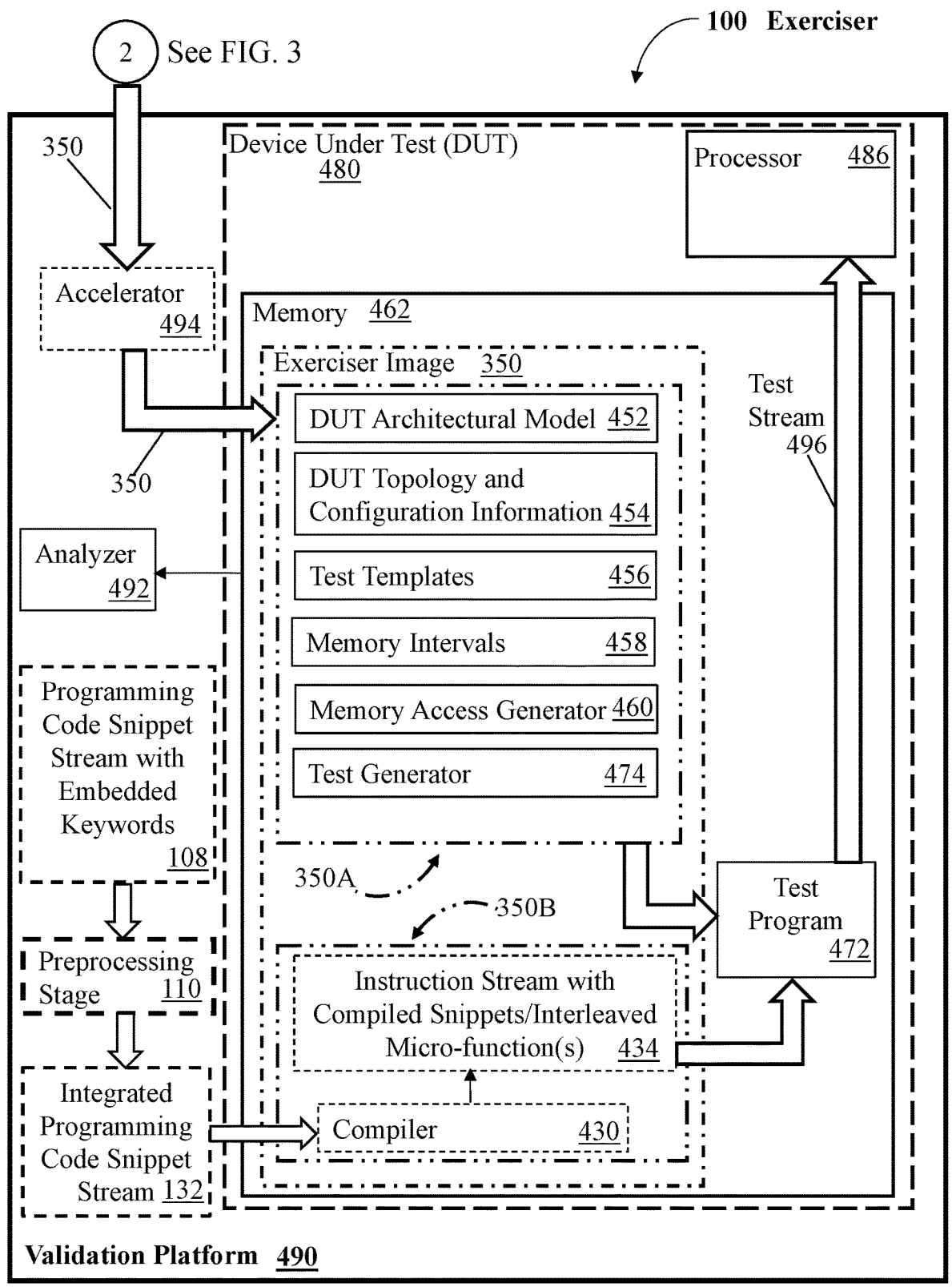
FIG. 4 is a block schematic diagram further illustrating the exerciser including a bare-metal validation platform, in accordance with some embodiments of the present disclosure.

Referring to FIG. 4, a block schematic diagram further illustrating the exerciser 100 including a bare-metal validation platform 490 is presented, in accordance with some embodiments of the present disclosure. Also continuing to refer to FIGS. 1 and 3, as described above, the validation computer system 102 is principally employed as the off-DUT portion of the exerciser 100 for exerciser image generation. In contrast, the validation platform 490 is principally employed as the on-DUT portion of the exerciser 100 for test program 472 execution. Also, as described above, the validation computer system 102 includes sufficient resources within the processing device 304, the memory device 306, and the system database device 308 to use the exerciser image builder 320 to build the exerciser image 350. The built exerciser image 350 is transmitted from the validation computer system 102 to the validation platform 490 through the I/O bus 310. In one or more embodiments, the exerciser image 350 includes sufficient program instructions configured to cause the DUT 480 to singly and repeatedly perform generation and execution of one or more test cases, i.e., test programs 472. For example, a same test program 472 may be executed a plurality of times, and the results may be compared for consistency. In some embodiments, the exerciser image 350 may include sufficient code to provide the DUT 480 with functionality that is not provided by the bare-metal validation platform 490, such as, and without limitation, operating system features such as, without limitation, interrupt handlers, address translation, and memory management. Once the exerciser image 350 is loaded onto the validation platform 490, the exerciser image 350 may be used to generate the test program 472 to be executed by the DUT 480 to perform a functional and/or operational validation thereof.

In one or more embodiments, the exerciser image 350 includes a first portion 350A as built and transmitted to the validation platform 490 by the validation computer system 102. In some embodiments, the exerciser image 350 also includes a second portion 350B discussed further below. The first portion 350A of the exerciser image 350 includes a DUT architectural model 452, a DUT topology and configuration information 454, and the test templates 456 that are based on the DUT architectural model 322, the DUT topology and configuration information 324, the base code 326, and the test templates 328, respectively, that have been selected and modified by the validation computer system 102 for the particular scheduled tests for the DUT 480. In addition, the exerciser image 350 includes memory intervals 458 that are based on the memory intervals 348 generated as previously described. In addition, in some embodiments, the exerciser image 350 includes a memory access generator 460 configured to execute the memory intervals 458. The validation platform 490 includes the exerciser image 350 resident within the memory 462 on the DUT 480. The exerciser image 350 is used to generate the particular test program 472 that will be executed and managed by a test generator 474 that is also embedded within the exerciser image 350. In some embodiments, the test generator 474 is a software artifact that coordinates the scheduling of the test cases, including the injection of the validation testing code and memory allocation.

In some embodiments, the exerciser image 350 includes a second portion 350B that includes a compiler 430 for on-DUT generation, where the compiler 430 is substantially similar to the compiler 130 that was employed for off-DUT generation of the integrated programming code snippet stream 132. For example, the compiler 430 is configured to receive the integrated programming code snippet stream 132 from the preprocessor 116 based on the programming code snippet stream 108 with the embedded keywords as described with respect to FIG. 1. Therefore, the respective programming code snippet stream 108, the preprocessor 116, and the integrated programming code snippet stream 132 are illustrated in phantom with respect to the association with the second portion 350B of the exerciser image 350.

The validation platform 490 also includes sufficient physical space and connection ports to receive the DUT 480. In some embodiments, the DUT 480 includes a processor 486 and the memory 462 is communicatively and operably coupled to the processor 486. In some embodiments, additional devices may be embedded within the DUT 480. Also, in some embodiments, the validation platform 490 includes, and without limitation, an analyzer 492, e.g., an oscilloscope, and an accelerator 494 (shown in phantom), which in some embodiments, may be an optional device. The accelerator 494 is used to accelerate the transmission of the exerciser image 350 into the memory 462 of the DUT 480. The results and other data captured during the validation testing may be captured in suitable collection devices not shown or the validation computer system 102. Accordingly, the validation platform 490 is configured to execute the validation testing of the DUT 480 through a bare-metal testing process.

Figure 5A:
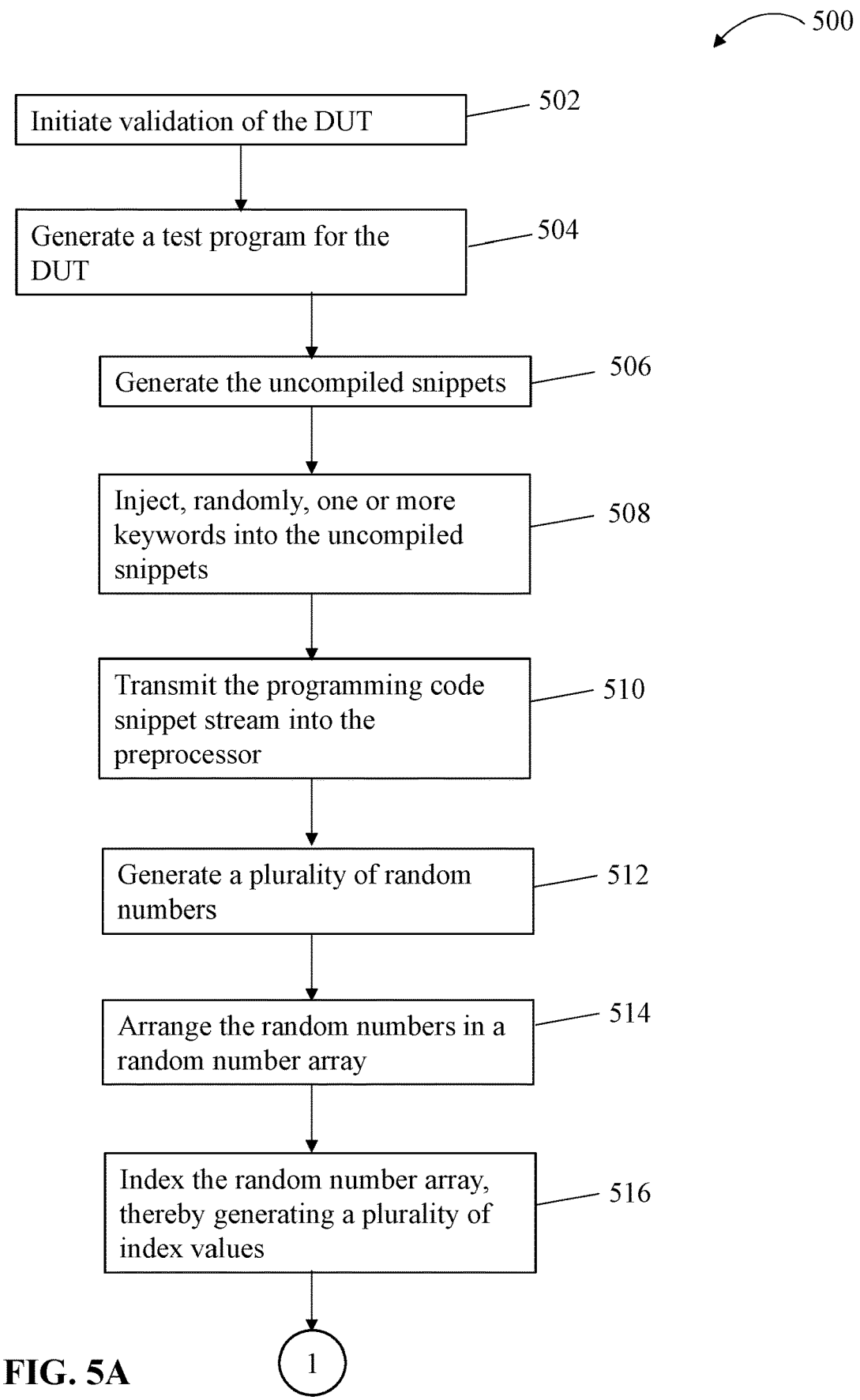
FIG. 5A is a flowchart illustrating a process for generating and executing post-silicon test programs for a device-undertest (DUT) using the exerciser, in accordance with some embodiments of the present disclosure.

Referring to FIG. 5A, a flowchart is presented illustrating a process 500 for generating and executing post-silicon test programs for the device-under-test (DUT) 480 (see FIG. 4) using the exerciser 100, in accordance with some embodiments of the present disclosure. Also referring to FIGS. 1-4, the process 500 starts with initiating 502 validation of the DUT 480 and generating 504 a test program for the DUT 480. In some embodiments, exerciser images 350 are built for the test programs 472 through the exerciser image builder 320. In some embodiments, the test templates 328 are previously generated, i.e., written by a user, and stored in the system database device 308 as a library of test templates 328. In some embodiments, the test templates 328 are selected either automatically, or by specific selection by a user to test one or more particular features of the DUT 480. The selection of test templates 328 may be for a particular test battery and may, or may not, be edited for such particular test battery. The test templates 328 include respective statements 344 therein that will be used to generate the instructions for executing the test programs 472. Accordingly, the statements 344 from the selected test templates 328 are selected subject to the order of the statements resident within the test template 328 and the respective statements 344 are injected into the exerciser image 350 through the exerciser image builder 320.

In at least some embodiments, the validation of the DUT 480 further includes generating memory allocations to be used during the validation testing of the DUT 480. The memory map 336 is injected into the memory manager 340 that is resident within the exerciser image builder 320. The memory map 336 includes the amount of memory 462 of the DUT 480 and its topology including, without limitation, descriptions of page boundaries, segment boundaries, and page attributes (e.g., cacheable or non-cacheable). The memory manager 340 generates one or more memory allocation requests 342. The memory allocation requests 342 are at least partially based on requirements embedded in the test templates 328. The memory allocation requests are transmitted to the memory allocator 346 that receives the memory allocation requests 342 from the memory manager 340.

In at least some embodiments, the exerciser image builder 320 randomly selects memory intervals 348 from the memory 462. The randomly selected memory intervals 3548 are injected into the exerciser image 350 through the exerciser image builder 320. Accordingly, random memory allocation embedded in the exerciser image facilitates enhancement of the performance of the validation testing.

In many embodiments, the exerciser image 350 includes a plurality of statements 344 from the respective test template 328 and the randomly selected memory intervals 348. Therefore, the process 500 includes continuing to select statements 344 in the order of occurrence in the test template 328 until all of the initial statements 344 from the test template 328 are processed and embedded in the initial exerciser image 350. In addition, the associated memory intervals 348 are injected into the exerciser image builder 320 for placement into the appropriate spots in the exerciser image 350.

The DUT validation process then proceeds to conducting the validation testing of the DUT 480 with the fully generated initial exerciser image 350. The fully generated initial exerciser image 350 is transmitted from the exerciser image builder 320 (or, in some embodiments, from the system database device 308) in the validation computer system 102 to the memory 462 of the DUT 480 through the I/O bus 310. The fully generated initial exerciser image 350, once transmitted to, and received by, the memory 462 of the DUT 480 is referred to as the first portion 350A of the exerciser image 350. The first portion 350A of the exerciser image 350 includes the DUT architectural model 452, the DUT topology and configuration information 454, and the test templates 456 that are based on the DUT architectural model 322, the DUT topology and configuration information 324, the base code 326, and the test templates 328, respectively, that have been selected and modified by the validation computer system 102 for the particular scheduled tests for the DUT 480. In addition, the first portion 350A of the initial exerciser image 350 includes the memory intervals 458 and the memory access generator 460. Moreover, the first portion 350A of the exerciser image 350 includes the test generator 474.

In at least some embodiments, upon receipt of the exerciser image in the DUT 480, the test generator 474 generates and executes the test programs 472 from the selected statements 344 embedded in the test template 356 through the exerciser image builder 320 with the randomly inserted memory intervals 458. Such generation of the testing instructions, i.e., generating a test program for the DUT 480, includes issuing hundreds of instructions in a non-blocking order, without manual complication of the templates, as the test stream 496.

In one or more embodiments, to further proceed with the validation testing of the DUT 480, a plurality of uncompiled snippets, i.e., the authored C-code snippets 104, are automatically generated 506. The authored C-code snippets 104 include a selection of programming code snippets, where in some instances, the selection is at least partially guided by one or more statements 344 in a respective test template 328, where such selection of snippets is called as previously described. Keywords 106, also generated as C-code, are automatically and randomly injected 508 into, and embedded in, the authored C-code snippets 104 to generate the programming code snippet stream 108 with embedded keywords. For example, in some embodiments, the keyword "RND" is injected randomly multiple times into the authored C-code snippets 104. The programming code snippet stream 108 with randomly embedded keyword RND 106 therein is automatically transmitted 510 to the preprocessor 116. Accordingly, the automatic generation 506 and random injection 508 of the one or more keywords 106, e.g., RND, to embed the keywords 106 into the uncompiled authored C-code snippets 104 facilitates enhancing the randomization of the respective validation processes.

In some embodiments, a plurality of random number elements 114 is generated 512 in the preprocessing stage 110 through the random number generator 112. In some embodiments, each random number is unique with no duplicates. The random number elements 114 are randomly arranged 514 in the random number array 118 within the preprocessor 116. The random number elements 114 in the random numbers array 118 are indexed 516, i.e., an index 122 for the random number array 118 is created where each occurrence of a consecutive incrementation along the index 122 (starting at zero and consecutively increasing by one integer therefrom) results in a pointer directed to a different place in the random number array 118 such that a different random number elements 114 is selected for each different index value. The incrementing of the index values facilitates iterations as described further herein. Accordingly, the random number generation 512, the arranging 514 in the random number array 118, and the indexing 516 of the random number array 118 in the index 122 facilitate randomization of the selection of the micro-functions from the library 124 that are to be interleaved with the compiled C-code snippets.

Figure 5B:
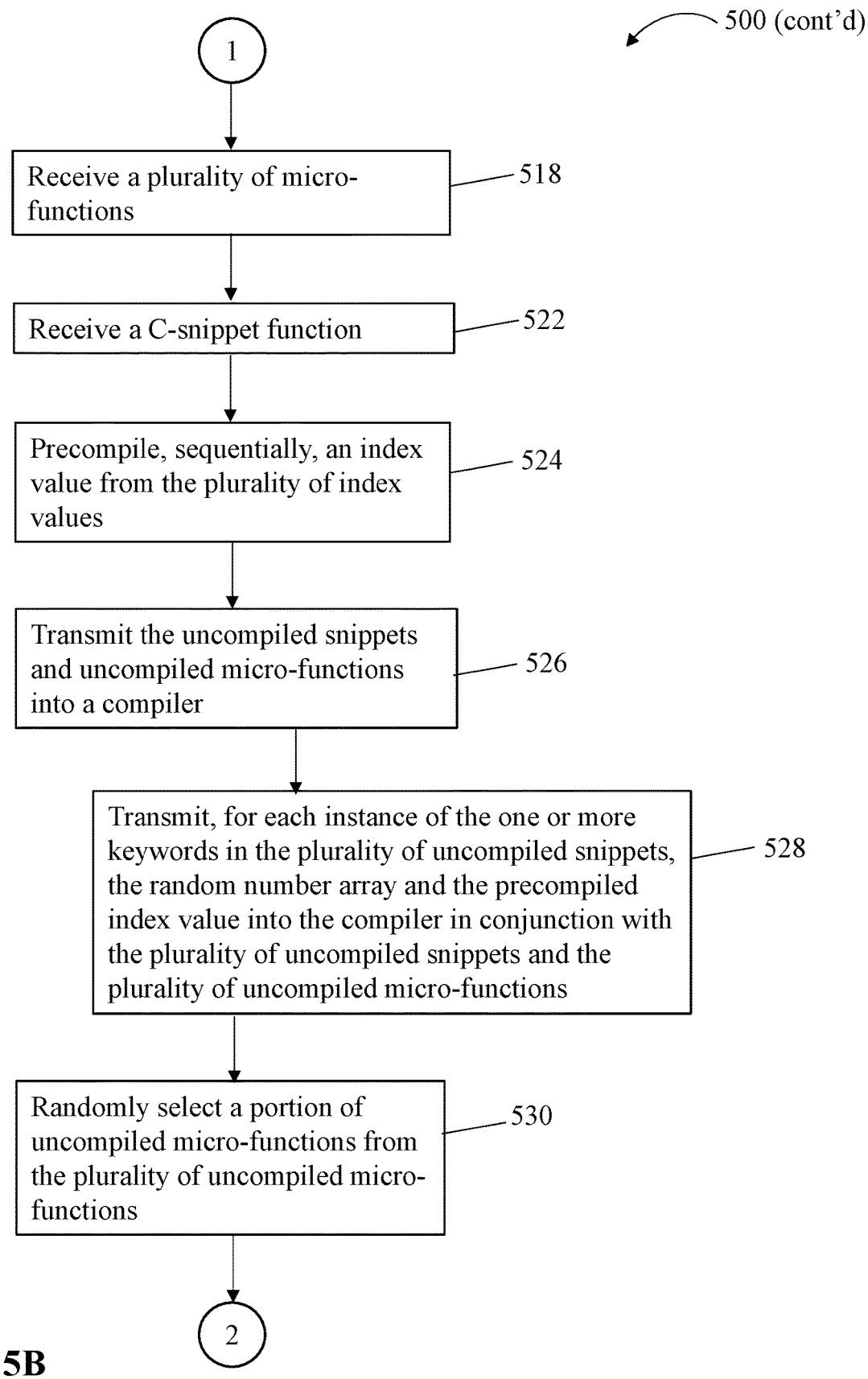
FIG. 5B is a continuation of the flowchart of FIG. 5A, in accordance with some embodiments of the present disclosure.

Referring to FIG. 5B, a continuation of the flowchart of FIG. 5A is presented, in accordance with some embodiments of the present disclosure. Continuing to refer to FIGS. 1-4, in some embodiments, the preprocessor 116 receives 518 the library of micro functions 124. The micro-functions from the library 124 are created in C-code and are configured to be integrated with, i.e., interleaved with the existing validation instructions, i.e., the test programs 472, that are at least partially generated from the authored C-code snippets 104 subsequent to compiling. Furthermore, in some embodiments, the preprocessor 116 receives 522 the C-snippet function 128. The C-snippet function 128 and the library of micro-functions 124 are associated with each other as described further herein.

In one or more embodiments, for each instance of the keyword RND 106 in the programming code snippet stream 108 entering the preprocessor 116, a number of actions are initiated. For example, the next consecutive index number from the index 122 is sequentially precompiled 524 by the preprocessor 116. Moreover, the uncompiled snippets, i.e., the authored C-code snippets 104 and the uncompiled library of micro-functions 124 (in its entirety) are injected into the programming code snippet stream 108 that includes the authored C-code snippets 104 to partially define the integrated programming code snippet stream 132. Therefore, the uncompiled micro-functions and the authored-Code snippets are transmitted 526 into the compiler 130. In addition, the precompiled index number from the index 122 and the random number array 118 (while maintaining their association with each other and the library of the micro-functions 124 as previously described), as well as the associated C-snippet function 128 are also injected into the programming code snippet stream 108 to create the integrated programming code snippet stream 132, thereby also creating an iteration of the integrated programming code snippet stream from the preprocessing stage 110. As such, the precompiled index number from the index 122 and the random number array 118 are transmitted 528 into the compiler 130. Accordingly, the precompiling 524 of the index values, the transmission 526 of the uncompiled snippets and uncompiled micro-functions into the compiler 130, and the transmission 528 of the precompiled index number from the index 122 and the random number array 118 into the compiler 130 further facilitate the random selection of the micro-functions to be interleaved with the snippets.

In at least some embodiments, the integrated programming code snippet stream 132 is transmitted to the compiler 130 to compile the incoming C-code into the respective machine language for executing the respective validation exercises. In some embodiments, an assembler is also used to generate assembly language; however, the embodiments described herein exclude the use of an assembler for clarity. With the integrated programming code snippet stream 132 resident within the compiler 130, a portion of uncompiled micro-functions from the plurality of uncompiled micro-functions are randomly selected 530 for compilation and subsequent interleaving with the compiled snippets, that will be further integrated with the rest of the present validation testing scheme.

Figure 5C:
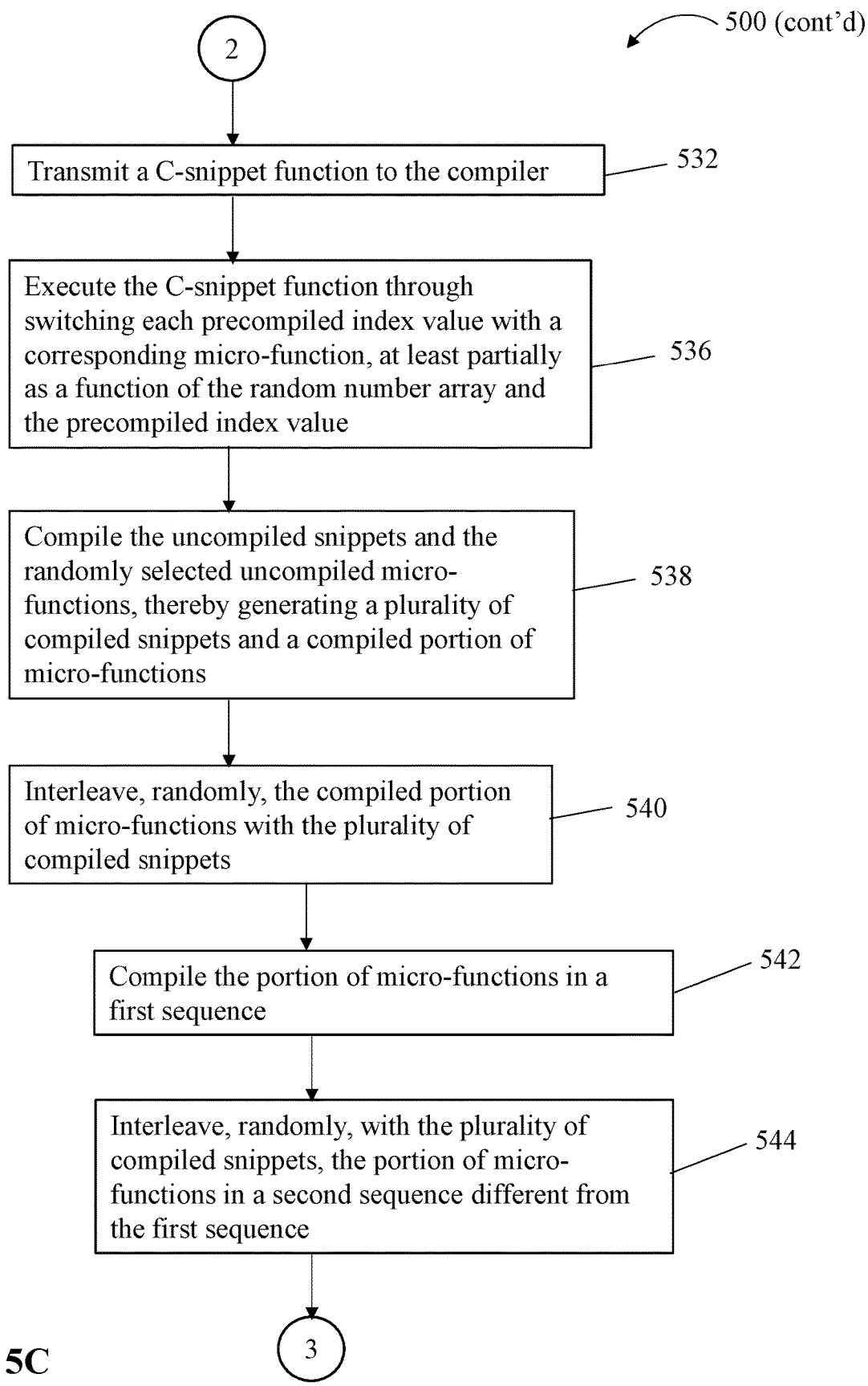
FIG. 5C is a continuation of the flowchart of FIG. 5B, in accordance with some embodiments of the present disclosure.

Referring to FIG. 5C, a continuation of the flowchart of FIG. 5B is presented, in accordance with some embodiments of the present disclosure. Continuing to refer to FIGS. 1-4. in at least some embodiments, the C-snippet function 128 is transmitted 532 into the compiler 130 and compiled. The precompiled index number(s) from the index 122 are compiled into the respective random number values that are used by the C-snippet function 128 as the case number(s) for the C-snippet function 128 to select the respective micro-function(s) from the library of micro-functions 124, where the embedded RND instructions initiate selection of the respective random micro-functions. The C-snippet function 128 executes 536 the switching function through switching each precompiled index value from the index 122 with a corresponding micro-function from the plurality (library) of micro-functions 124, at least partially as a function of the random number array 118 and the associated precompiled index value from the index 122. Accordingly, transmitting 532 the C-snippet function 128 with the switching features to the compiler 130 and executing 536 the switching function further facilitates the random selection of the micro-functions to be interleaved with the snippets.

Specifically, in at least some embodiments, rather than compiling all of the micro-functions in the library 124, only those micro-functions indicated for further calling and interleaving with the authored C-code snippets 104 are compiled through using the precompiled index numbers from the index 122. Once compiled, the index numbers from the index 122 result in the randomly selected random number values from the random number array 118 indicating the respective cases through the C-snippet function 128. As such, a portion of the uncompiled micro-functions (e.g., micro-functions 1, 2, and 3) from the plurality of uncompiled micro-functions 124 are randomly selected. Accordingly, selection of the respective micro-function is achieved through the employment of the established relationships between the precompiled index number from the index 122, the random number array 118, and the library of micro-functions 124, through the C-snippet function 128. In addition, the remaining micro-functions of the library of micro-functions 124 are discarded.

The index number from the index 122, the random number array 118, and the unselected micro-functions in the library 124 are discarded with no further action thereon. The authored C-code snippets 104 and the selected micro-functions, i.e., micro-functions 1, 2, and 3, are compiled 538 together for the subsequent validation exercises of the DUT, i.e., the selected compiled micro-functions 1, 2, and 3 are interleaved 540, randomly, with the compiled authored C-code snippets to define the instruction stream 134 including the compiled snippets plus the interleaved one or more micro-functions 1, 2, and 3. Accordingly, compiling 538 the randomly selected micro-functions and snippets and randomly interleaving 540 them facilitates generating a plurality of unique validation test programs.

Accordingly, each instance of the codeword RND entering the preprocessor results in an iteration of a different random selection of micro-functions from the library 124 to be interleaved with the rest of the authored C-code snippets 104 to create the instruction stream 134, where duplication of subsequent portions of the interleaved instruction stream is quite unlikely, thereby enhancing the complexity and the robustness of the validation of the DUT.

In some embodiments, for an iteration of the compiling and interleaving, the portion of the micro-functions, i.e., the selected micro-functions, are compiled 542 in a first sequence, e.g., and without limitation, the sequence of micro-function 1, micro-function 2, and micro-function 3. However, the portion of the micro-functions are randomly interleaved 544 with the plurality of compiled snippets such that the sequence of the compiled portion of the micro-functions is in a second sequence different from the first sequence e.g., and without limitation, micro-function 2, micro-function 1, and micro-function 3 (see the discussion of the instruction stream 134 with respect to FIG. 2). Accordingly, the compiling 542 of the portion of micro-functions in a first sequence and the subsequent interleaving 544 of the micro-functions with the plurality of compiled snippets in a second sequence different from the first sequence facilitates further randomization of the validation operations is achieved while further increasing the number of test programs 472 that may be executed.

Figure 5D:
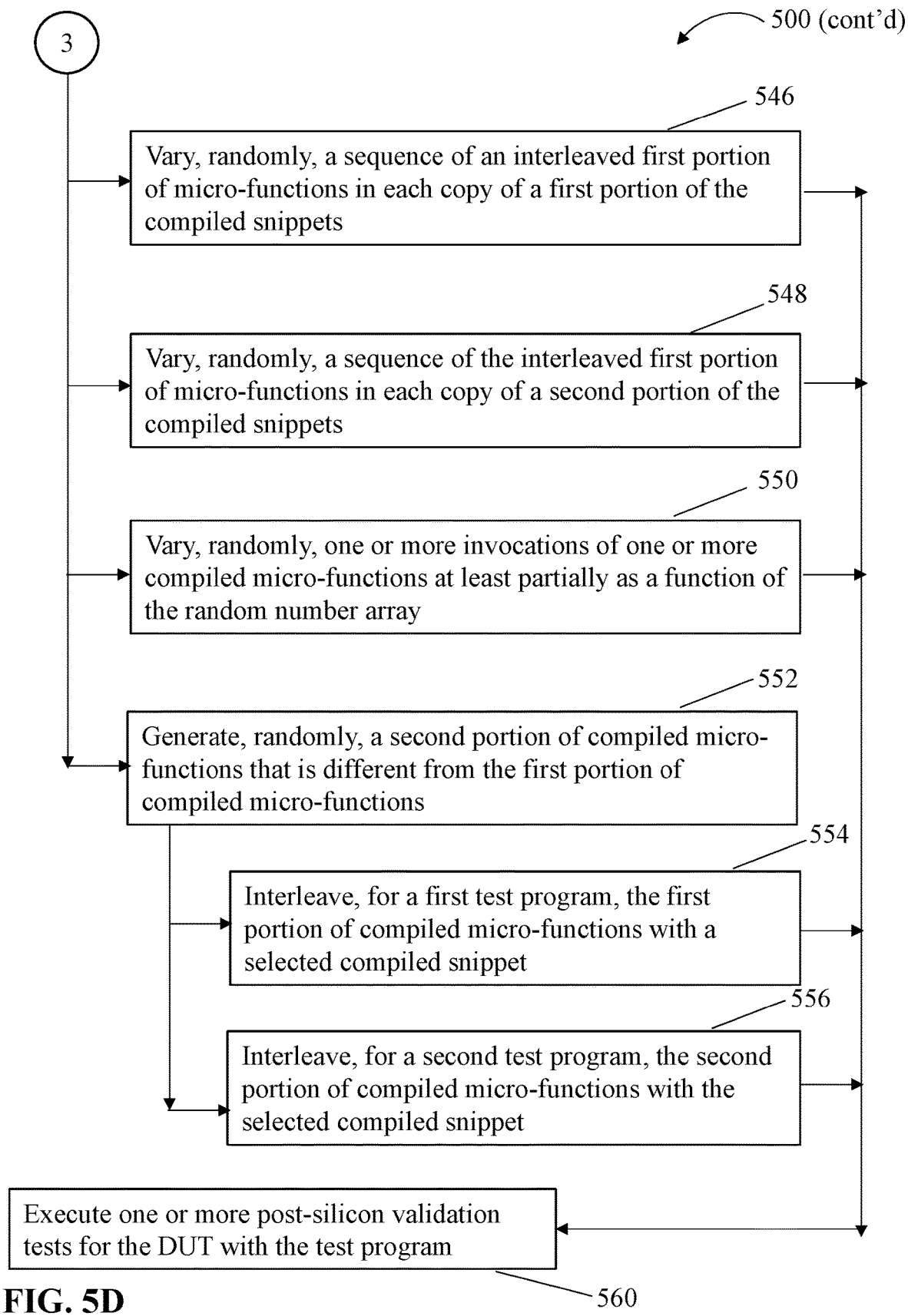
FIG. 5D is a continuation of the flowchart of FIG. 5C, in accordance with some embodiments of the present disclosure.

Referring to FIG. 5D, a continuation of the flowchart of FIG. 5C is presented, in accordance with some embodiments of the present disclosure. Continuing to refer to FIGS. 1-4. in some embodiments, the previously discussed random reordering of the micro-functions 1, 2, and 3 through the compiler 130 in the instruction stream 134 is used in conjunction with the compiler 130 making copies of the authored C-code snippets 104. In these embodiments, the selected micro-functions 1, 2, and 3 are randomly interleaved with the respective copies of the authored C-code snippets 104 with varying 546 sequences of the selected micro-functions 1, 2, and 3. Such operations create different instruction streams 134 to further enhance the robustness of the validation testing through varying the instructions, while maintaining the intent and results of the respective test programs 472 through all of the iterations of the copies. Therefore, each test program 472 has a different sequence of the interleaved micro-functions 1, 2, and 3. In some embodiments, the results of each test program 472 with the varying sequences of the micro-functions 1, 2, and 3 are compared to validate the respective operations. In some embodiments, the number of copies of the authored C-code snippets 104 is selected at random by the compiler 130. Accordingly, varying 546, randomly, a sequence of an interleaved first portion of micro-functions in each copy of a first portion of the compiled snippets facilitates further randomization of the validation operations is achieved while further increasing the number of test programs 472 that may be executed.

In some embodiments, the compiler 130 will use the same selected micro-functions 1, 2, and 3 on a different authored-C-code snippet 104 to further vary 548 sequences of the selected micro-functions 1, 2, and 3 to create different instruction streams 134 to further enhance the robustness of the validation testing through varying the instructions, while maintaining the intent and results of the respective test programs 472 through all of the iterations. In some embodiments, the selected authored C-code snippet 104 is selected randomly. As such, the random multiple positioning of the selected micro-functions interleaved with one or more of the authored-C-code snippets 104 facilitates creating many more test programs 472 using the same template without expending additional resources directed toward randomization of subsequent selections of the micro-functions. Accordingly, since the second (i.e., different) portion of the plurality of compiled snippets in step 548 is different from the first portion of the plurality of compiled snippets in step 546, further randomization of the validation operations is achieved while further increasing the number of test programs 472 that may be executed.

In one or more embodiments, the compiler 130 will randomly vary 550 one or more invocations of one or more compiled micro-functions at least partially as a function of the random number array 118. Specifically, in at least some embodiments, the employment of the random number elements 114 from the random number array 118 is extended to the uncompiled micro-functions from the library 124 to further enhance the randomization of the validation processes through using the random number elements 114 from the random number array 118 to vary the invocations of the uncompiled micro-functions from the library 124 and generate, through the compiler 130, varying invocations of the compiled micro-functions. For example, and without limitation, if a micro-function is configured to execute an operation of copying a block of memory, the number of bytes of the memory to copy are randomized per invocation of the same micro-function.

Such use of the random number elements 114 from the random number array 118 with respect to the selected micro-functions from the library 124 is executed through the preprocessor 116 in a manner similar to that for the authored C-code snippets 104, including the random number array 118 and the _COUNTER_ macro 120. For example, and without limitation, referring to the library of micro-functions 124 in FIG. 2, the "*CacheStressAreas[random¬_index] =CACHE_STRESS_DATA;" line associated with the micro-function 1 is used to employ the random selection of the index value for the micro-function 1. The index values associated with the [random_index] invocation will be associated with respective values for the micro-function 1 calls. Therefore, for each instance of the RND keyword, or a different keyword to further randomize the test programs 472, different invocations of the micro-function 1 will yield at least some variations in the respective test programs 472. Accordingly, varying 550, randomly, one or more invocations of one or more compiled micro-functions at least partially as a function of the random number array further randomization of the validation operations is achieved while further increasing the number of test programs 472 that may be executed.

In at least some embodiments, rather than changing the sequence of selected micro-functions for one or more copies of one or more selected snippets, different selected micro-functions are used to further enhance the randomness and robustness of the validation testing. In such embodiments, the process 500 further includes generating 552, randomly, a second portion of compiled micro-functions that is different from the first portion of compiled micro-functions. For example, rather than the micro-functions 1, 2, and 3, any other micro-functions (i.e., a second portion) other than those three micro-functions (i.e., a first portion) are randomly selected and compiled and interleaved with a selected compiled snippet as described above for the first portion of the micro-functions. In addition, in such embodiments, the interleaving portion includes interleaving 554, for a first test program 472 of the plurality of test programs 472, the first portion of compiled micro-functions with a selected compiled snippet from the plurality of compiled snippets, and subsequently interleaving 556, for a second test program 472 of the plurality of test programs 472, the second portion of compiled micro-functions with the selected compiled snippet. Specifically, the first portion of micro-functions are interleaved with a compiled snippet, and in a subsequent test, a second portion of micro-functions different from the first portion of micro-functions are interleaved with a copy of the same compiled snippet. Accordingly, the random multiple selections of micro-functions interleaved with a particular authored-C-code snippet 104 as described for steps 552, 554, and 556 facilitates creating many more unique test programs 472.

The process 500 includes executing 560 one or more post-silicon validation tests for the DUT 480 with the test program 472. In at least some embodiments, the process 500 includes the use of the compiler 130 to facilitate automatically generating test programs 472 that fully utilize the testing pipeline from the exerciser image 350 through the processor 486 of the DUT 480. Therefore, the compiler 130 creates off-DUT compiler generated code snippets, i.e., the instruction stream 134 including compiled snippets plus interleaved micro-functions as a means of augmenting the validation testing of the DUT 480 through creating complex test programs which stimulate the entire width of the testing pipeline.

In at least some embodiments, the CPUs on modern chips are optimized for the compiled code that compilers generate, such compiled code being much more complex than unstructured code, and the use of compiled code facilitates testing those features on the DUT 480. Therefore, as the test instructions for the test program 472 are generated from the statements 344 embedded in the initial test template 456 through the test generator 474, a call for the associated instruction stream 134 will be injected into the appropriate portion of the test program 472 as guided by the respective statement 344. Specifically, in some embodiments, one or more of the authored C-code snippets 104 are transmitted into the compiler 130 (with the other artifacts as described herein). Typically, the selection of authored C-code snippets 104 is guided by a particular statement 344 in the respective test template 328 through criteria embedded within the statement 344. If there is more than one authored C-code snippet 104 that matches a selection criterion, the exerciser image builder 320 will select one of the authored C-code snippets 104 randomly. This selected authored C-code snippet 104 will be compiled by the compiler 130 and the compiled snippet will be added to the exerciser image 350 as the exerciser image 350 runs on the DUT 480 and the compiled snippets are injected into the test program 472 according to the respective statement 344 in the respective test template 456. Additionally, the test generator 474 will prepare parameters required for this snippet call and add them into the respective test program 472. This call and the respective parameters will be added exactly as the test template 456 determines.

In some embodiments, the authored C-code snippets 104, the C-snippet functions 128, and the library of micro-functions 124 are coded using the C programming language. In some embodiments, any programming language that enables operation of the exerciser 100 through the process 500 as described herein is used. The authored C-code snippets 104 and the library of micro-functions 124 are created to generate specific testing conditions. In general, the test generator 474 generates test programs 472 transmitted through the test stream 496 that are intrinsically pseudo-random. The creation of, and transmission of, the authored C-code snippets 104 and the library of micro-functions 124 through the compiler 130 facilitate increasing the randomness of the validation test exercises. In addition, in addition to the micro-functions from the library 124, small modular function test templates 456 may be generated to test any unique features on the DUT 480, including, without limitation, special engines, accelerators, and independent execution units that are configured for the different data types, e.g., and without limitation, Floating Point (FP), General Purpose (GP), and Vector. Furthermore, the types of the values being operated on may be changed from instance-to-instance of the authored C-code snippets 104 with interleaved micro-functions. For example, a first instruction stream 134 may be directed toward integers, and a second instruction stream 134 may be directed toward floating points. Moreover, the relatively small, compiled snippets facilitate increasing the parallelism of the test templates 456, and therefore, the parallelism of the exerciser image 350. Therefore, the complexity of the more elaborate instruction streams 134 may enhance the complexity of the test programs 472, that, in some embodiments, are substantially written by a human.

In addition, the parameters of the exerciser 100 may also be used for the programming code snippets compiling operation through the compiler 130, thereby further facilitating consistency of the instruction stream 134 with the remainder of the exerciser 100. Moreover, the compiler 130 is configured to further streamline the injected authored C-code snippets 104 through the compiler's 130 intrinsic properties to remove portions of the code that are not useful and optimize the code. In addition, other optimization features of the compiler 130 may be maintained and leveraged, such as loop counter prediction, where counter prediction is a technique that improves the performance of processors by guessing the next instruction address before it is known. Even though breaking the code up into the authored C-code snippets 104 and the micro-functions from the library 124 facilitates overcoming such intrinsic properties, the compiler 130 does not remove any portions of the authored C-code snippets 104 and the micro-functions from the library 124. Such features thereby allow code to remain in the instruction stream 134 that typically might not otherwise make it to the test program 472 due to elimination of purposely added deficiencies that are designed to stress the DUT 480. Furthermore, in some instances, any leaner instruction streams 134 facilitate eliminating sequential dependencies within the test program 472 by eliminating such dependencies in the individually contained compiled snippets and micro-functions and configuring the compiled snippets and micro-functions to run as many concurrently as practical, thereby significantly reducing a potential for one portion of the instruction stream 134 to block another due to inferred sequential requirements. Also, the use of smaller, modular, functional compiled snippets and interleaved micro-functions in the test facilitates generating unique test programs 472 that may be configured to further stress the DUT 480. Moreover, more than one version of the compiler 130 may be used to generate the compiled snippets and interleaved micro-functions to take advantage of the different compiling features of each.

In general, compilers are configured to inhibit the randomization of the memory through attempting to load as much of the compiled code into one page of memory to reduce the chance of memory interruption across the memory device such that the portions of the code are proximate each other. However, the validation testing attempts to do the opposite to stress the DUT 480, even with the simplest code loading to process. Also, in general, the DUT 480 will likely be configured to handle sequential memory access in a serialized manner with little to no stressing. Therefore, portions of the code and data allocations may be randomized as described herein to disrupt serial memory access. As described above, compilers are typically configured to allocate compiled code and data so that it can be accessed sequentially, which makes it easier and more efficient for the CPU. The compilers described herein are configured to allocate test instructions and the associated data in an "interesting" manner so that CPU will work hard to fetch instructions and the required data. The random memory intervals significantly reduce the ordered memory allocation, thereby, in at least some instances, defeating the ordered memory access and thereby increasing the stress on the DUT 480 during the validation testing. In at least some embodiments, data that would typically be properly aligned, valid, protected, and flushed under normal operation of the DUT 480 may now be retained and used to enhance the stressing of the DUT 480. Accordingly, the previously discussed generation and ingestion of the authored C-code snippets 104 and the micro-functions from the library 124 by the compiler 130 compiles the instruction streams 134 as guided by the respective invocations by the statements 344 in conjunction with randomly allocating the memory stacks to be tested.

In some embodiments, for a typical program written in C programming language, under standard processing conditions, the compiler and an associated linker (not shown) configure the memory sections in a manner that should avoid any data collisions, where the data will reside in one page, and would fit perfectly in cache. However, as described herein, authored C-code snippets 104 and the library of micro-functions 124 are used rather than whole programs, including the introduction of the statements and the memory intervals to deliberately disorganize the data during the validation testing to maximize disruptive events, such as, and without limitation, data collisions.

In at least some embodiments, as the validation testing with the present, i.e., initial test program 472 is exhausted, the initial round of validation testing is completed, the test results will be recorded and checked, and the exerciser 100 will proceed to the next round of test program generation and testing, i.e., iterative validation testing will be continued. In at least some embodiments, the validation testing for a particular DUT 480 will require multiple test programs 472 to fully test the features on the DUT 480. As previously described herein, a test template 328 may be selected to test one or more particular features of the DUT 480. At least a portion of the statements 344 within the test template 328 include some ambiguity, and for those statements with sufficient ambiguities, a set of variant instructions will be generated for each statement, where the set of variant instructions are at least slightly different from the first set of instructions used for the initial round of testing. Therefore, the subsequent test programs may be at least slightly different from the initial test program. In some embodiments, it is possible to build many different exerciser images 350 from a single test template 328 and more than one test program 472 may be created with a single exerciser image 350. Also, in some embodiments, a particular exerciser image 350 may be used to execute the validation testing substantially endlessly until test execution is stopped, either manually, due to a predetermined time limit, or one or more checking failures are determined through the testing. In at least some embodiments, the process 500 proceeds to building the next exerciser image 350 for the next test program(s) 472 through the exerciser image builder 320 and the remainder of the test programs 472 intended to be executed. The process 500 will continue until the required number of exerciser images 350 are built and the test programs 472 for each respective exerciser image 350 have run their allotted amount of time.

In some embodiments, rather than using the off-DUT embodiment of the compiler 130 (as shown in FIG. 1), the on-DUT compiler 430 as shown in FIG. 4 (see the second portion 350B of the exerciser image 350) is used. The compiler 430 compiles the integrated programming code snippet stream 132 to generate the instruction stream 434 with the compiled snippets and interleaved micro-functions 434 that facilitate building the plurality of test programs 472. A substantial number of the operations associated with the process 500 for the off-DUT embodiment are substantially similar to that for the on-DUT embodiment. In some on-DUT embodiments, the test generator 474 randomly chooses which of instantiation (as previously described for the off-DUT embodiments) to run per test program 472. Accordingly, the on-DUT embodiment of the compiler 430 facilitates augmenting the test program 472 during validation testing.

The system, computer program product, and method as disclosed and described herein integrates compiler-based testing in post-silicon validation. As described herein, the test programs generated automatically through known validation techniques are enhanced through the use of compiler-generated instructions to augment the existing instructions through either an off-DUT or on-DUT creation of compiler generated code snippets and interleaved micro-functions from programming code written in a higher-level language. In addition, the existing random memory allocation features further enhance the use of the compiled instructions to fully utilize the testing and DUT pipeline, including any special engines and accelerators, if present, through issuing hundreds of random instructions in a non-blocking order, without manual complication of the templates and without adding further complexity to the test generator, for parallel execution thereof. In some embodiments, the exerciser as described herein may be used to test a model of the DUT on simulator or a hardware accelerator in pre-silicon validation.

The addition of compilers to the post-silicon validation process facilitates automatically adding test coverage and verification value to the existing test templates through substantially seamless integration of the compiler snippets and the interleaved micro-functions to the test generated by the exerciser at little additional cost in image size and image build time. However, a large test generation and execution time reduction may be realized through more extensive use of optimized C-code and less extensive use of user XML macros. Also, the complexity of the tests may be enhanced through the introduction of the compiled instructions coupled with the random memory intervals. In addition, automating the insertion of the compiled test instructions and the automated random memory allocations decrease the potential for human error being introduced during the image building activities and the validation test execution activities. In some embodiments, if there are issues associated with the C-code, the standard debugging tools may be applied to identify the source of the error.

The off-DUT compiler embodiments described herein and the on-DUT compiler embodiments automatically enhance the test programs used to generate the test streams transmitted to the DUT during run-time without increasing the size and complexity of the exerciser image. The incorporation of the compiler-generated code snippets and interleaved micro-functions into test generation increases the parallelization through combining traditional generation with assembly code produced by the compilers from higher-level languages adds variability to the compiler-created code. In addition, such incorporation of creation of compiler generated code snippets and interleaved micro-functions, as a means of augmenting the test generator and the created tests, enables complex test scenarios which stimulate the entire width of the pipeline, and/or any special engines or accelerators on the DUT. Moreover, the existing randomness of the testing sequences is preserved without adding complexity to the test generator.

The use of embedded codewords in the uncompiled snippet stream results in, for each instance of the codeword, an iteration of a different random selection of micro-functions to be interleaved with the rest of the authored C-code snippets to create a validation instruction stream, where duplication of subsequent portions of the interleaved instruction stream is quite unlikely, thereby enhancing the complexity and the robustness of the validation of the DUT. In addition, instantiation mechanisms involving copies of specific uncompiled snippets with varying micro-functions to create different instruction streams 134 to further enhance the robustness of the validation testing through varying the instructions, while maintaining the intent and results of the respective test programs through all of the iterations of the copies.

Therefore, the embodiments disclosed herein provide an improvement to computer technology. For example, the generation processes as described herein facilitate post-silicon validation test generation that is more comprehensive as compared to known post-silicon tests. The implemented test generation and test execution operations as described herein include features to increase the frequency of data collisions. Therefore, the enhanced test generation and execution as described herein facilitates augmenting the intensity of the stress testing operations on the DUT. Accordingly, the improvement to computer technology is manifested in a practical technical application of the methods described herein to execute post-silicon validation testing of hardware devices through enhancing the generation of the tests and the execution thereof on the hardware being tested.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, computer readable storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of one or more transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Figure 6:
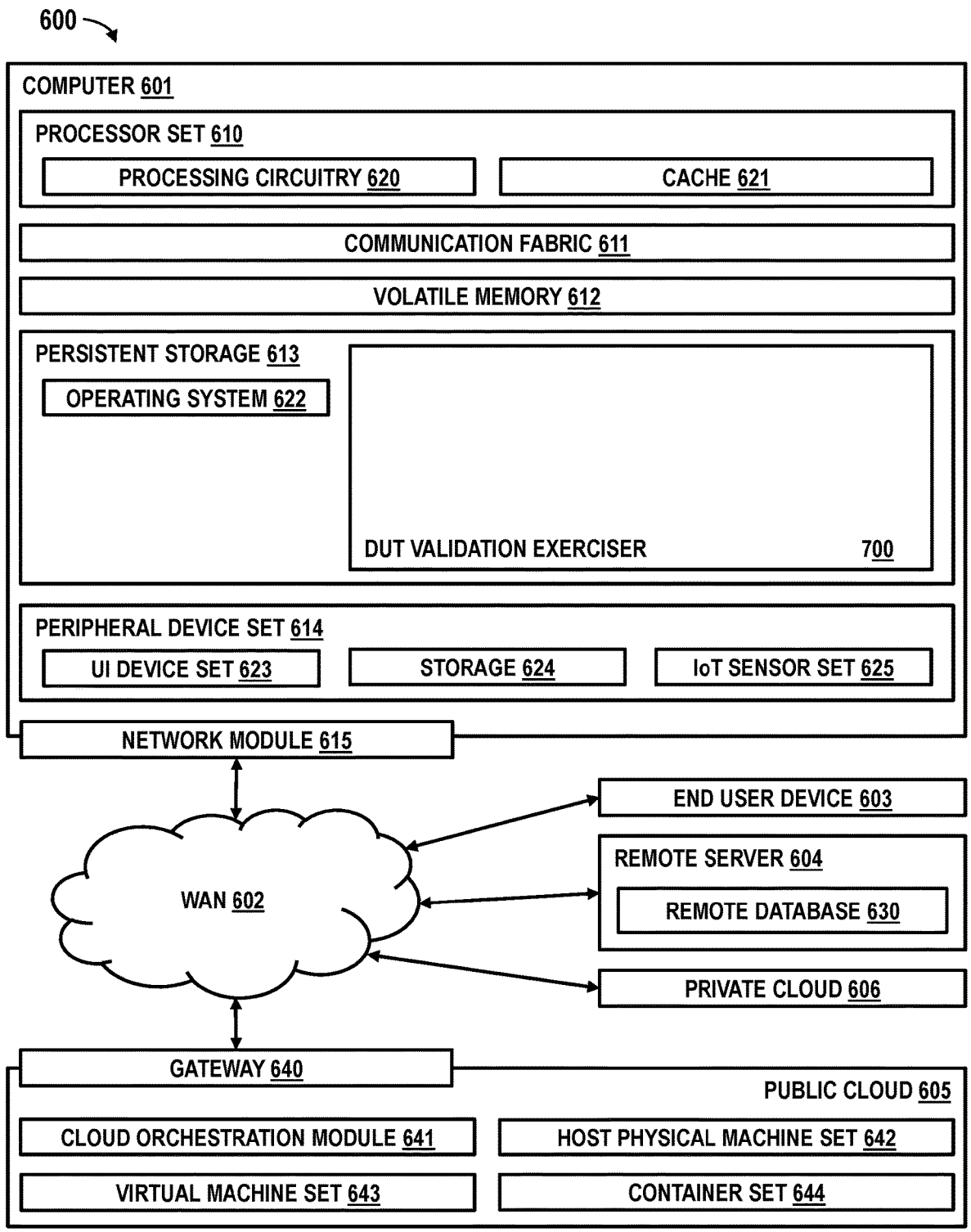
FIG. 6 is as block schematic diagram illustrating an example of a computing environment for the execution of at least some of the computer code involved in performing the disclosed methods described herein, in accordance with some embodiments of the present disclosure.

Referring to FIG. 6, a block schematic diagram is presented illustrating an example of a computing environment for the execution of at least some of the computer code involved in performing the disclosed methods described herein, in accordance with some embodiments of the present disclosure.

Computing environment 600 contains an example of an environment for the execution of at least some of the computer code involved in performing the disclosed methods, such as DUT validation exerciser 700. In addition to block 700, computing environment 600 includes, for example, computer 601, wide area network (WAN) 602, end user device (EUD) 603, remote server 604, public cloud 605, and private cloud 606. In this embodiment, computer 601 includes processor set 610 (including processing circuitry 620 and cache 621), communication fabric 611, volatile memory 612, persistent storage 613 (including operating system 622 and block 700, as identified above), peripheral device set 614 (including user interface (UI) device set 623, storage 624, and Internet of Things (IoT) sensor set 625), and network module 615. Remote server 604 includes remote database 630. Public cloud 605 includes gateway 640, cloud orchestration module 641, host physical machine set 642, virtual machine set 643, and container set 644.

Computer 601 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 630. As is well understood in the art of computer technology, and depending upon the technology, performance of a computer-implemented method may be distributed among multiple computers and/or between multiple locations. On the other hand, in this presentation of computing environment 600, detailed discussion is focused on a single computer, specifically computer 601, to keep the presentation as simple as possible. Computer 601 may be located in a cloud, even though it is not shown in a cloud in FIG. 6. On the other hand, computer 601 is not required to be in a cloud except to any extent as may be affirmatively indicated.

Processor set 610 includes one, or more, computer processors of any type now known or to be developed in the future. Processing circuitry 620 may be distributed over multiple packages, for example, multiple, coordinated integrated circuit chips. Processing circuitry 620 may implement multiple processor threads and/or multiple processor cores. Cache 621 is memory that is located in the processor chip package(s) and is typically used for data or code that should be available for rapid access by the threads or cores running on processor set 610. Cache memories are typically organized into multiple levels depending upon relative proximity to the processing circuitry. Alternatively, some, or all, of the cache for the processor set may be located "off chip." In some computing environments, processor set 610 may be designed for working with qubits and performing quantum computing.

Computer readable program instructions are typically loaded onto computer 601 to cause a series of operational steps to be performed by processor set 610 of computer 601 and thereby effect a computer-implemented method, such that the instructions thus executed will instantiate the methods specified in flowcharts and/or narrative descriptions of computer-implemented methods included in this document (collectively referred to as "the disclosed methods"). These computer readable program instructions are stored in various types of computer readable storage media, such as cache 621 and the other storage media discussed below. The program instructions, and associated data, are accessed by processor set 610 to control and direct performance of the disclosed methods. In computing environment 600, at least some of the instructions for performing the disclosed methods may be stored in block 700 in persistent storage 613.

Communication fabric 611 is the signal conduction path that allows the various components of computer 601 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

Volatile memory 612 is any type of volatile memory now known or to be developed in the future. Examples include dynamic type random access memory (RAM) or static type RAM. Typically, volatile memory 612 is characterized by random access, but this is not required unless affirmatively indicated. In computer 601, the volatile memory 612 is located in a single package and is internal to computer 601, but, alternatively or additionally, the volatile memory may be distributed over multiple packages and/or located externally with respect to computer 601.

Persistent storage 613 is any form of non-volatile storage for computers that is now known or to be developed in the future. The non-volatility of this storage means that the stored data is maintained regardless of whether power is being supplied to computer 601 and/or directly to persistent storage 613. Persistent storage 613 may be a read only memory (ROM), but typically at least a portion of the persistent storage allows writing of data, deletion of data and rewriting of data. Some familiar forms of persistent storage include magnetic disks and solid state storage devices. Operating system 622 may take several forms, such as various known proprietary operating systems or open source Portable Operating System Interface-type operating systems that employ a kernel. The code included in block 900 typically includes at least some of the computer code involved in performing the disclosed methods.

Peripheral device set 614 includes the set of peripheral devices of computer 601. Data communication connections between the peripheral devices and the other components of computer 601 may be implemented in various ways, such as Bluetooth connections, Near-Field Communication (NFC) connections, connections made by cables (such as universal serial bus (USB) type cables), insertion-type connections (for example, secure digital (SD) card), connections made through local area communication networks and even connections made through wide area networks such as the internet. In various embodiments, UI device set 623 may include components such as a display screen, speaker, microphone, wearable devices (such as goggles and smart watches), keyboard, mouse, printer, touchpad, game controllers, and haptic devices. Storage 624 is external storage, such as an external hard drive, or insertable storage, such as an SD card. Storage 624 may be persistent and/or volatile. In some embodiments, storage 624 may take the form of a quantum computing storage device for storing data in the form of qubits. In embodiments where computer 601 is required to have a large amount of storage (for example, where computer 601 locally stores and manages a large database) then this storage may be provided by peripheral storage devices designed for storing very large amounts of data, such as a storage area network (SAN) that is shared by multiple, geographically distributed computers. IoT sensor set 625 is made up of sensors that can be used in Internet of Things applications. For example, one sensor may be a thermometer and another sensor may be a motion detector.

Network module 615 is the collection of computer software, hardware, and firmware that allows computer 601 to communicate with other computers through WAN 602. Network module 615 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 615 are performed on the same physical hardware device. In other embodiments (for example, embodiments that utilize software-defined networking (SDN)), the control functions and the forwarding functions of network module 615 are performed on physically separate devices, such that the control functions manage several different network hardware devices. Computer readable program instructions for performing the disclosed methods can typically be downloaded to computer 601 from an external computer or external storage device through a network adapter card or network interface included in network module 615.

WAN 602 is any wide area network (for example, the internet) capable of communicating computer data over non-local distances by any technology for communicating computer data, now known or to be developed in the future. In some embodiments, the WAN 602 may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

End user device (EUD) 603 is any computer system that is used and controlled by an end user (for example, a customer of an enterprise that operates computer 601), and may take any of the forms discussed above in connection with computer 601. EUD 603 typically receives helpful and useful data from the operations of computer 601. For example, in a hypothetical case where computer 601 is designed to provide a recommendation to an end user, this recommendation would typically be communicated from network module 615 of computer 601 through WAN 602 to EUD 603. In this way, EUD 603 can display, or otherwise present, the recommendation to an end user. In some embodiments, EUD 603 may be a client device, such as thin client, heavy client, mainframe computer, desktop computer and so on.

Remote server 604 is any computer system that serves at least some data and/or functionality to computer 601. Remote server 604 may be controlled and used by the same entity that operates computer 601. Remote server 604 represents the machine(s) that collect and store helpful and useful data for use by other computers, such as computer 601. For example, in a hypothetical case where computer 601 is designed and programmed to provide a recommendation based on historical data, then this historical data may be provided to computer 601 from remote database 630 of remote server 604.

Public cloud 605 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 605 is performed by the computer hardware and/or software of cloud orchestration module 641. The computing resources provided by public cloud 605 are typically implemented by virtual computing environments that run on various computers making up the computers of host physical machine set 642, which is the universe of physical computers in and/or available to public cloud 605. The virtual computing environments (VCEs) typically take the form of virtual machines from virtual machine set 643 and/or containers from container set 644. It is understood that these VCEs may be stored as images and may be transferred among and between the various physical machine hosts, either as images or after instantiation of the VCE. Cloud orchestration module 641 manages the transfer and storage of images, deploys new instantiations of VCEs and manages active instantiations of VCE deployments. Gateway 640 is the collection of computer software, hardware, and firmware that allows public cloud 605 to communicate through WAN 602.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

Private cloud 606 is similar to public cloud 605, except that the computing resources are only available for use by a single enterprise. While private cloud 606 is depicted as being in communication with WAN 602, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 605 and private cloud 606 are both part of a larger hybrid cloud.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer system to execute a test program for a device-under-test (DUT) comprising:
   a validation platform;
   a compiler communicatively coupled to the validation platform; and
   a preprocessor communicatively coupled to the compiler, wherein:
   the preprocessor is configured to transmit a plurality of uncompiled authored C-code snippets and a plurality of uncompiled micro-functions into the compiler;
   the compiler is configured to:
   randomly select a portion of uncompiled micro-functions from the plurality of uncompiled micro-functions;
   compile the uncompiled authored C-code snippets and the portion of uncompiled micro-functions, thereby generating a plurality of compiled authored C-code snippets and a compiled portion of micro-functions; and
   interleave, randomly, the compiled portion of micro-functions with the plurality of compiled authored C-code snippets, thereby at least partially generating a test program for the DUT; and the validation platform is configured to execute one or more post-silicon validation tests for the DUT with the test program.

2. The system of claim 1, the validation platform further configured to:
generate the plurality of uncompiled authored C-code snippets; and
embed, randomly, one or more keywords into the uncompiled authored C-code snippets.

3. The system of claim 1, the preprocessor further configured to:
generate a plurality of random numbers;
arrange the plurality of random numbers in a random number array; and
index the random number array, thereby generating a plurality of index values.

4. The system of claim 3, the preprocessor further configured to:
precompile, sequentially, an index value from the plurality of index values; and
transmit, for each instance of one or more keywords in the plurality of uncompiled authored C-code snippets, the random number array and the precompiled index value into the compiler in conjunction with the plurality of uncompiled authored C-code snippets and the plurality of uncompiled micro-functions.

5. The system of claim 4, wherein:
the preprocessor is configured to transmit a switch function into the compiler with the precompiled index value, the random number array, and the plurality of uncompiled micro-functions; and
the compiler is configured to:
switch each precompiled index value with a corresponding micro-function from the plurality of uncompiled micro-functions, at least partially as a function of the random number array and the associated precompiled index value.

6. The system of claim 5, wherein the compiler is further configured to:
compile the portion of uncompiled micro-functions in a first sequence; and
interleave randomly, with the plurality of compiled authored C-code snippets, the portion of compiled micro-functions in a second sequence different from the first sequence.

7. The system of claim 6, wherein the compiler is further configured to:
generate a plurality of test programs through one or more of:
varying, randomly, a sequence of an interleaved first portion of compiled micro-functions in each copy of a plurality of copies of a first portion of the plurality of compiled authored C-code snippets, wherein the second portion of the plurality of compiled authored C-code snippets is different from the first portion of the plurality of compiled authored C-code snippets;
varying, randomly, one or more invocations of one or more compiled micro-functions at least partially as a function of the random number array;
generating, randomly, a second portion of compiled micro-functions that is different from the first portion of compiled micro-functions;
interleaving, for a first test program of the plurality of test programs, the first portion of compiled micro-functions with a selected compiled authored C-code snippet of the plurality of compiled authored C-code snippets; and
interleaving, for a second test program of the plurality of test programs, the second portion of compiled micro-functions with the selected compiled authored C-code snippet of the plurality of compiled authored C-code snippets.

8. A computer readable storage medium having computer executable instructions that when executed by at least one computing device executes a test program for a device-under-test (DUT), comprising instructions to:
transmit a plurality of uncompiled authored C-code snippets and a plurality of uncompiled micro-functions into a compiler;
select, randomly, a portion of uncompiled micro-functions from the plurality of uncompiled micro-functions;
compile the uncompiled authored C-code snippets and the portion of uncompiled micro-functions, thereby generating a plurality of compiled authored C-code snippets and a compiled portion of micro-functions;
interleave, randomly, the compiled portion of micro-functions with the plurality of compiled authored C-code snippets, thereby at least partially generating a test program for the DUT; and
execute one or more post-silicon validation tests for the DUT with the test program.

9. The computer readable storage medium of claim 8, further comprising instructions to:
generate the plurality of uncompiled authored C-code snippets; and
embed, randomly, one or more keywords into the uncompiled authored C-code snippets.

10. The computer readable storage medium of claim 8, further comprising instructions to:
generate a plurality of random numbers;
arrange the plurality of random numbers in a random number array; and
index the random number array, thereby generating a plurality of index values.

11. The computer readable storage medium of claim 10, further comprising instructions to:
precompile, sequentially, an index value from the plurality of index values; and
transmit, for each instance of one or more keywords in the plurality of uncompiled authored C-code snippets, the random number array and the precompiled index value into the compiler in conjunction with the plurality of uncompiled authored C-code snippets and the plurality of uncompiled micro-functions.

12. The computer readable storage medium of claim 11, further comprising instructions to:
transmit a switch function into the compiler with the precompiled index value, the random number array, and the plurality of uncompiled micro-functions; and
switch each precompiled index value with a corresponding micro-function from the plurality of uncompiled micro-functions, at least partially as a function of the random number array and the associated precompiled index value.

13. The computer readable storage medium of claim 12, further comprising instructions to:
compile the portion of uncompiled micro-functions in a first sequence; and
interleave, randomly, with the plurality of compiled authored C-code snippets, the portion of compiled micro-functions in a second sequence different from the first sequence.

14. A computer-implemented method for executing a test program for a device-under-test (DUT), comprising:

transmitting a plurality of uncompiled authored C-code snippets and a plurality of uncompiled micro-functions into a compiler;

selecting, randomly, a portion of uncompiled micro-functions from the plurality of uncompiled micro-functions;

compiling the uncompiled authored C-code snippets and the portion of uncompiled micro-functions, thereby generating a plurality of compiled authored C-code snippets and a compiled portion of micro-functions;

interleaving, randomly, the compiled portion of micro-functions with the plurality of compiled authored C-code snippets, thereby at least partially generating a test program for the DUT; and executing one or more post-silicon validation tests for the DUT with the test program.

15. The method of claim 14, further comprising:

generating the plurality of uncompiled authored C-code snippets; and embedding, randomly, one or more keywords into the uncompiled authored C-code snippets.

16. The method of claim 14, further comprising:

generating a plurality of random numbers;

arranging the plurality of random numbers in a random number array; and indexing the random number array, thereby generating a plurality of index values.

17. The method of claim 16, further comprising:

precompiling, sequentially, an index value from the plurality of index values; and transmitting, for each instance of one or more keywords in the plurality of uncompiled authored C-code snippets, the random number array and the precompiled index value into the compiler in conjunction with the plurality of uncompiled authored C-code snippets and the plurality of uncompiled micro-functions.

18. The method of claim 17, further comprising:

transmitting a switch function into the compiler with the precompiled index value, the random number array, and the plurality of uncompiled micro-functions; and switching each precompiled index value with a corresponding micro-function from the plurality of uncompiled micro-functions, at least partially as a function of the random number array and the associated precompiled index value.

19. The method of claim 18, further comprising:

compiling the portion of uncompiled micro-functions in a first sequence; and interleaving, randomly, with the plurality of compiled authored C-code snippets, the portion of compiled micro-functions in a second sequence different from the first sequence.

20. The method of claim 19, further comprising:

generating a plurality of test programs through one or more of:

varying, randomly, a sequence of an interleaved first portion of compiled micro-functions in each copy of a plurality of copies of a first portion of the plurality of compiled authored C-code snippets;

varying, randomly, a sequence of the interleaved first portion of compiled micro-functions in each copy of a plurality of copies of a second portion of the plurality of compiled authored C-code snippets, wherein the second portion of the plurality of compiled authored C-code snippets is different from the first portion of the plurality of compiled authored C-code snippets;

varying, randomly, one or more invocations of one or more compiled micro-functions at least partially as a function of the random number array;

generating, randomly, a second portion of compiled micro-functions that is different from the first portion of compiled micro-functions;

interleaving, for a first test program of the plurality of test programs, the first portion of compiled micro-functions with a selected compiled authored C-code snippet of the plurality of compiled authored C-code snippets; and interleaving, for a second test program of the plurality of test programs, the second portion of compiled micro-functions with the selected compiled authored C-code snippet of the plurality of compiled authored C-code snippets.

* * * * *